US012754487B2

(12) United States Patent
Mitra

(10) Patent No.: US 12,754,487 B2
(45) Date of Patent: Oct. 6, 2026

(54) PATTERN FORMING METHOD, SEMICONDUCTOR DEVICE MANUFACTURING METHOD, AND TEMPLATE

(71) Applicant: Kioxia Corporation, Tokyo (JP)

(72) Inventor: Anupam Mitra, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 655 days.

(21) Appl. No.: 18/178,358

(22) Filed: Mar. 3, 2023

(65) Prior Publication Data

US 2023/0408935 A1 Dec. 21, 2023

(30) Foreign Application Priority Data

Jun. 21, 2022 (JP) ................................ 2022-099537

(51) Int. Cl.
*G03F 9/00* (2006.01)
*G03F 7/00* (2006.01)
*H10P 76/20* (2026.01)

(52) U.S. Cl.
CPC .......... *G03F 9/7042* (2013.01); *G03F 7/0002* (2013.01); *H10P 76/2041* (2026.01)

(58) Field of Classification Search
CPC . G03F 7/0002; G03F 9/7042; H01L 21/0271; H01L 21/0274; H01L 21/31144; H01L 21/76819; H10B 43/50
See application file for complete search history.

(56) References Cited

U.S. PATENT DOCUMENTS

| | | | | | |
|---|---|---|---|---|---|
| 2008/0042319 | A1* | 2/2008 | Ando | B82Y 10/00 | 264/293 |
| 2009/0189306 | A1* | 7/2009 | Terasaki | B82Y 10/00 | 264/293 |
| 2010/0096776 | A1* | 4/2010 | Xu | B82Y 40/00 | 264/293 |
| 2010/0187714 | A1* | 7/2010 | Kobiki | B82Y 40/00 | 264/135 |

(Continued)

FOREIGN PATENT DOCUMENTS

| | | | |
|---|---|---|---|
| JP | 2008244259 | A | 10/2008 |
| JP | 4939994 | B2 | 5/2012 |

(Continued)

OTHER PUBLICATIONS

Japanese Office Action dated Mar. 3, 2026, mailed in counterpart Japanese Application No. 2022-099537, 6 pages.

*Primary Examiner* — Xiao S Zhao
*Assistant Examiner* — Victoria Bartlett
(74) *Attorney, Agent, or Firm* — Kim & Stewart LLP

(57) ABSTRACT

According to one embodiment, a pattern forming method includes placing a resin material on a film to be processed; pressing a template including a plurality of patterns protruding from a reference plane against the resin material to form a first resin film having first and second patterns, separated from each other in a first direction, and a third pattern between the first and second patterns; forming a second resin film that covers the first resin film; selectively exposing and developing the second resin film to expose the first and second patterns; and processing the film to be processed via the first and second resin films to transfer the first and second patterns to the film to be processed.

11 Claims, 25 Drawing Sheets

(56) References Cited

U.S. PATENT DOCUMENTS

| | | | | |
|---|---|---|---|---|
| 2011/0195189 | A1 * | 8/2011 | Kawamura ............ | B82Y 40/00 427/259 |
| 2015/0162194 | A1 * | 6/2015 | Clevenger ............. | B81C 1/0046 438/692 |

FOREIGN PATENT DOCUMENTS

| | | | |
|---|---|---|---|
| JP | 2014011431 | A | 1/2014 |
| JP | 2014160754 | A | 9/2014 |
| JP | 2015167203 | A | 9/2015 |
| JP | 5993230 | B2 | 9/2016 |
| JP | 6303268 | B2 | 4/2018 |
| WO | 2015133102 | A1 | 9/2015 |

* cited by examiner

PATTERN FORMING METHOD, SEMICONDUCTOR DEVICE MANUFACTURING METHOD, AND TEMPLATE

CROSS-REFERENCE TO RELATED APPLICATION

This application is based upon and claims the benefit of priority from Japanese Patent Application No. 2022-099537, filed Jun. 21, 2022, the entire contents of which are incorporated herein by reference.

FIELD

Embodiments described herein relate generally to a pattern forming method using imprint lithography, a semiconductor device manufacturing method, and a template for use in imprint lithography.

BACKGROUND

In a semiconductor device manufacturing process, an imprint process for transferring a pattern of a template to a resist film to form a desired pattern may be performed. However, when the pattern coverage (pattern density) within a pattern transfer region is different, air bubbles or the like may form in the resist film where the pattern is sparse and thus cause a resist pattern formation defect.

DETAILED DESCRIPTION

Embodiments concern a pattern forming method, a semiconductor device manufacturing method, and a template by which a resist pattern formation defect can be prevented in imprint lithography.

In general, according to one embodiment, a pattern forming method includes: placing a resin material on a film to be processed; pressing a template having a plurality of patterns protruding from a reference plane against the resin material to form a first resin film having first and second patterns, which are separated from each other in a first direction, and a third pattern between the first and second patterns; forming a second resin film to cover the first resin film; exposing and developing the second resin film to expose the first and second patterns; and processing the film to be processed via the first and second resin films to transfer the first and second patterns to the film to be processed.

Certain example embodiments of the present disclosure are described below with reference to the drawings. The present disclosure is not limited to these example embodiments.

Embodiment 1

Embodiment 1 is described below with reference to the drawings.

(Configuration Example of Semiconductor Device)

Figure 1A:
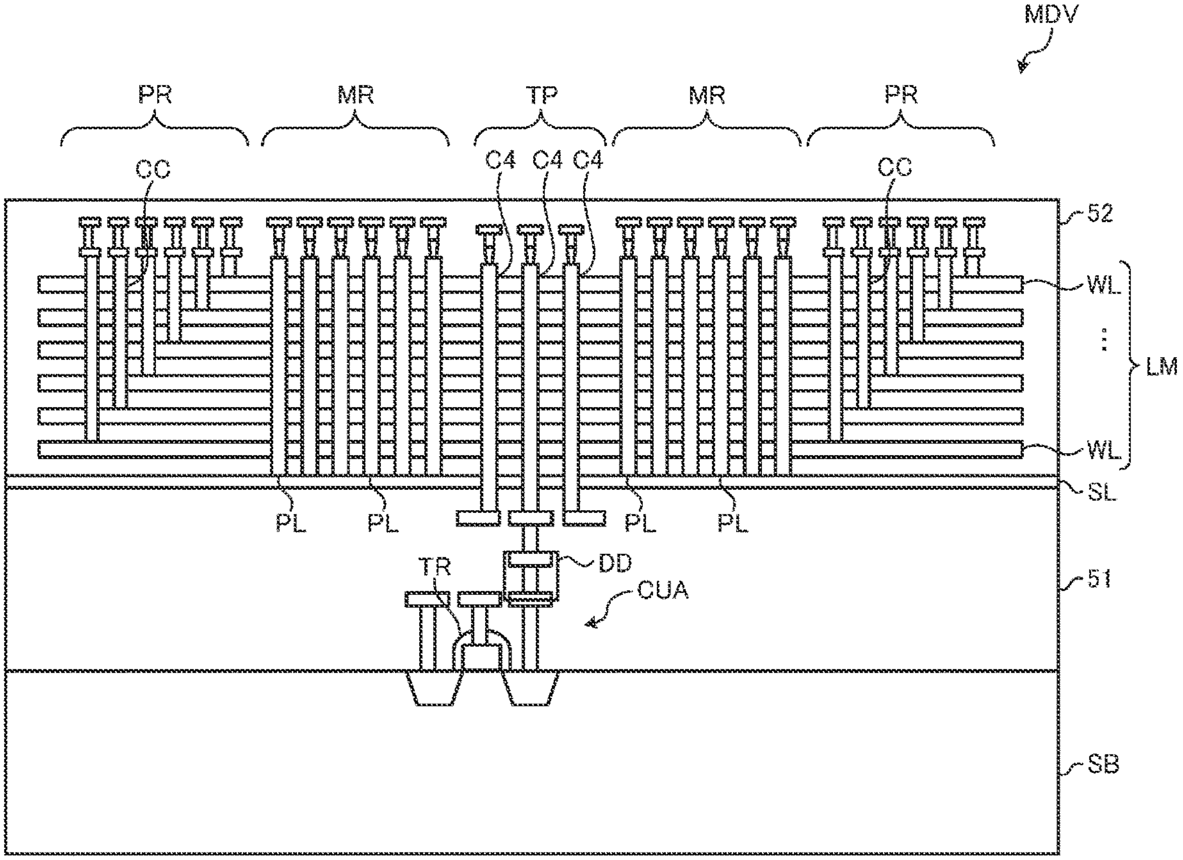
FIGS. 1A and 1B are cross-sectional views illustrating an example of a configuration of a semiconductor device according to Embodiment 1.
Figure 1B:
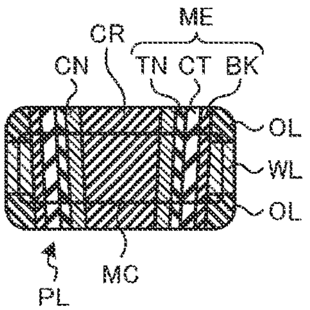

FIGS. 1A and 1B are cross-sectional views illustrating an example of a configuration of a semiconductor device MDV according to Embodiment 1. FIG. 1A is a cross-sectional view illustrating a schematic configuration of the semiconductor device MDV, and FIG. 1B is an enlarged cross-sectional view of pillars PL in the semiconductor device MDV. In FIG. 1A, hatching is omitted in order to improve the visibility of the drawing.

As illustrated in FIG. 1A, the semiconductor device MDV includes a peripheral circuit CUA, a source line SL, and a stacked body LM on a substrate SB, which may be a silicon substrate. The peripheral circuit CUA includes a transistor TR or the like formed on the substrate SB and contributes to an electrical operation of memory cells. The peripheral circuit CUA is covered with an insulating film 51 such as a silicon oxide film. The source line SL that is a conductive polysilicon layer or the like is formed on the insulating film 51.

The stacked body LM on the source line SL has a configuration in which a plurality of word lines WL are stacked. Examples of the word lines WL include a tungsten layer and a molybdenum layer. The number of stacked word lines WL is, for example, about several tens to hundreds. Though not illustrated in FIG. 1A, insulating layers OL such as silicon oxide layers (see FIG. 1B) are interposed between the plurality of word lines WL.

The stacked body LM includes memory regions MR, contact regions PR, and a through contact region TP, and a plurality of pillars PL and a plurality of contacts CC and C4 are provided in each region. The entire stacked body LM is covered with an insulating film 52 such as a silicon oxide film.

The plurality of pillars PL each penetrate the stacked body LM and reach the source line SL. Detailed configurations of the pillars PL are illustrated in FIG. 1B.

As illustrated in FIG. 1B, the pillar PL includes a memory layer ME and a channel layer CN in an order from the outer periphery of the pillar PL, and a further inside a portion of the channel layer CN is filled with a core layer CR. The memory layer ME has a multilayer structure in which a block insulating layer BK, a charge storage layer CT, and a tunnel insulating layer TN are stacked in an order from the outer periphery of the pillar PL. The memory layer ME is not located in a lower end portion of the pillar PL, and the channel layer CN inside thereof is connected to the source line SL.

The channel layer CN is, for example, a semiconductor layer such as a polysilicon layer or an amorphous silicon layer. The core layer CR, the tunnel insulating layer TN, and the block insulating layer BK are, for example, silicon oxide layers. The charge storage layer CT is, for example, a silicon nitride layer.

With such a configuration, a plurality of memory cells MC located in the height direction are formed at intersections of the pillars PL and the word lines WL. By applying a predetermined voltage from the word line WL to the memory cell MC at the same height position, charges are accumulated in the charge storage layer CT of the memory cell MC or charges are extracted from the charge storage layer CT so that data can be written to and read from the memory cell MC. The data read from the memory cell MC is transmitted to a sense amplifier via information plug of the pillar PL, an upper layer wiring, and the like.

Each of the contacts CC reaches a depth position corresponding to one of the plurality of word lines WL provided in the stacked body LM and is electrically connected to that corresponding word line WL. Further, each of the plurality of contacts CC is connected to the contacts C4 via the upper layer wirings and plugs.

The plurality of contacts C4 penetrate the stacked body LM and the source line SL and reach the insulating film 51 below the stacked body LM. In the insulating film 51, the lower end portions of the plurality of contacts C4 are connected to the transistor TR of the peripheral circuit CUA via the lower layer wiring, vias, contacts, and the like.

With such a configuration, a predetermined voltage can be applied from the peripheral circuit CUA to each memory cell MC via the contacts C4 and CC to electrically operate the memory cells MC.

In the semiconductor device MDV having the above configuration, a configuration having a three-dimensional shape with a highly advanced three-dimensional structure can be easily formed by, for example, an imprint process using a template. Examples of the configuration having a highly advanced three-dimensional structure include a dual damascene structure DD in which vias and wiring for electrically connecting the contact C4 and the peripheral circuit CUA are collectively (simultaneously) formed and the contacts CC respectively reach word lines WL at different depths of the stacked body LM.

(Configuration Example of Imprint Apparatus)

Next, a configuration example of an imprint apparatus 1 used in a process of manufacturing the semiconductor device MDV described above is described with reference to FIG. 2.

Figure 2:
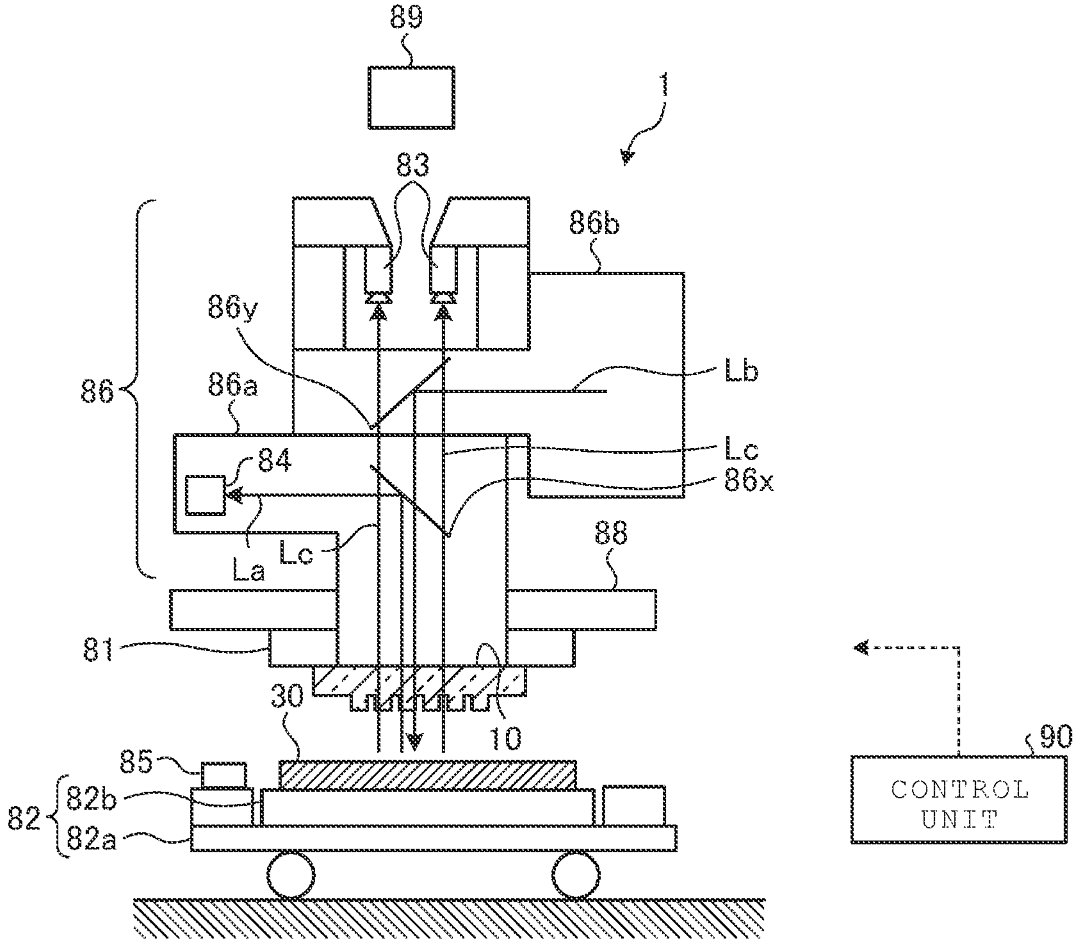
FIG. 2 is a diagram illustrating a configuration example of an imprint apparatus according to Embodiment 1.

FIG. 2 is a diagram illustrating a configuration example of the imprint apparatus 1 according to Embodiment 1. As illustrated in FIG. 2, the imprint apparatus 1 includes a template stage 81, a wafer stage 82, an alignment scope 83, a spread scope 84, a reference mark 85, an alignment unit 86, a stage base 88, a light source 89, and a control unit 90.

Next, a template 10 that transfers a pattern to a resist on a wafer 30 is provided in the imprint apparatus 1. The template 10 is configured with a transparent member such as quartz and is located so that a transfer pattern faces the wafer stage 82 on which the wafer 30 is mounted. The wafer 30 is, for example, a disk-shaped silicon substrate and is later cut into chips to be the substrates SB of the semiconductor devices MDV described above.

The wafer stage 82 includes a wafer chuck 82*b* and a main body 82*a*. The wafer chuck 82*b* fixes the wafer 30 to a predetermined position on the main body 82*a*. The reference mark 85 is provided on the wafer stage 82. The reference mark 85 is used for alignment when the wafer 30 is loaded onto the wafer stage 82.

The wafer stage 82 mounts the wafer 30 and moves in a plane parallel to the mounted wafer 30 (in a horizontal plane). The wafer stage 82 moves the wafer 30 below the template 10 when a transfer process to the wafer 30 is performed.

The stage base 88 supports the template 10 by the template stage 81 and moves in a vertical direction (perpendicular direction) to press the transfer pattern of the template 10 against the resist on the wafer 30.

The alignment unit 86 is provided onto the stage base 88. The alignment unit 86 detects the position of the wafer 30 and the position of the template 10 based on alignment marks provided on the wafer 30 and the template 10, respectively.

The alignment unit 86 includes a detection system 86*a* and an illumination system 86*b*. The illumination system 86*b* irradiates the wafer 30 and the template 10 with light. The detection system 86*a* detects images of alignment marks of the wafer 30 and the template 10 by the alignment scope 83 and aligns the wafer 30 and the template 10 based on the detection results. When the template 10 is pressed against the resist of the wafer 30, the detection system 86*a* detects by the spread scope 84 whether the resist fills the transfer pattern of the template 10.

The detection system 86*a* and the illumination system 86*b* respectively include mirrors 86*x* and 86*y* such as dichroic mirrors that function as image forming units. The mirrors 86*x* and 86*y* form images from the wafer 30 and the template 10 with the light from the illumination system 86*b*.

Specifically, the light Lb from the illumination system 86*b* is reflected by the mirror 86*y* downward where the template 10 and the wafer 30 are located. Light La from the wafer 30 and the template 10 is reflected by the mirror 86*x* toward the detection system 86*a* and travels to spread scope 84. Light Lc from the wafer 30 and the template 10 passes through the mirrors 86*x* and 86*y* and travels to the alignment scope 83 above.

The light source 89 is a device for emitting light such as ultraviolet light capable of curing the resist and is provided above the stage base 88. The light source 89 emits the light from above the template 10 while the template 10 is being pressed against the resist. However, as long as the resist can be cured, the light emitted from the light source 89 may be infrared light, visible light, electromagnetic waves, or the like, other than ultraviolet light.

The control unit 90 is an information processing device that performs various processes for controlling the imprint apparatus 1. The control unit 90 includes, for example, a central processing unit (CPU), a read only memory (ROM), and a random access memory (RAM) and includes a computer that performs a predetermined arithmetic process and a predetermined control process according to programs.

The control unit 90 controls the template stage 81, the wafer stage 82, the stage base 88, the light source 89, and the like, based on the observation images acquired by the alignment scope 83, the spread scope 84, and the like.

(Configuration Example of Template)

Next, a configuration example of the template 10 used for the imprint process by the imprint apparatus 1 is described with reference to FIGS. 3A and 3B. Here, an example of the template 10 for forming the contacts CC reaching the word lines WL at different depths of the stacked body LM is described as an example of a configuration having a highly advanced three-dimensional structure.

Figure 3A:
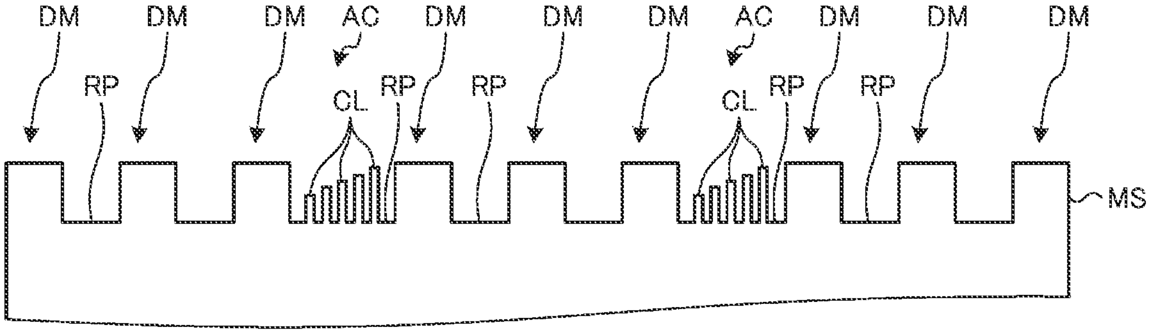
FIGS. 3A and 3B are schematic views illustrating an example of a configuration of a template according to Embodiment 1.
Figure 3B:
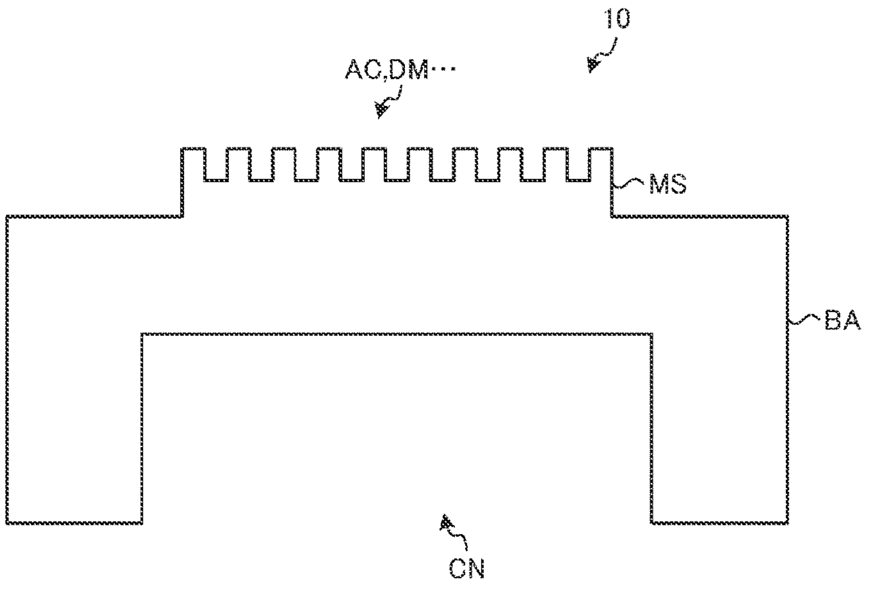

FIGS. 3A and 3B are schematic views illustrating an example of a configuration of the template 10 according to Embodiment 1. FIG. 3A is an enlarged cross-sectional view of actual patterns AC and dummy patterns DM of the template 10, and FIG. 3B is a cross-sectional view illustrating an overall configuration of the template 10.

As illustrated in FIG. 3B, the template 10 includes a transparent substrate BA made of quartz or the like. The transparent substrate BA includes a mesa portion MS protruding toward the front surface side, which is one surface of the transparent substrate BA. A counterbore CN is formed on the rear surface side of the transparent substrate BA. As a result, the central portion of the rear surface of the transparent substrate BA is recessed.

The actual patterns AC and the dummy patterns DM are provided in the mesa portion MS. The actual patterns AC are patterns that are to be transferred to a film to be processed ("process film") and form a part of the semiconductor device MDV. The dummy pattern DM is a dummy pattern that disappears without being transferred to the process film.

As illustrated in FIG. 3A, the actual patterns AC and the dummy patterns DM protrude from reference planes RP of the mesa portion MS. The plurality of actual patterns AC are separated from each other, for example, in the direction along the reference plane RP. The dummy patterns DM are located between adjacent actual patterns AC and between the actual patterns AC and the outer edge of the mesa portion MS.

Each actual pattern AC includes therein a plurality of the columnar-shaped patterns CL having different protrusion heights from the reference plane RP. In the example of FIG. 3A, these columnar-shaped patterns CL are sequentially heightened along one direction. However, the relative positioning and height arrangement order of the plurality of columnar-shaped patterns CL are not limited to the example shown in FIG. 3A and may be freely set in design.

In the example of FIG. 3A, the difference in height between the adjacent columnar-shaped patterns CL is, for example, about several nanometers to several hundreds of nanometers. These columnar-shaped patterns CL are, for example, quadrangular columns each occupying approximately the same area on the reference plane RP but having different heights from the reference plane RP. The number of columnar-shaped patterns CL is, for example, about several tens to hundreds and the spacing between such patterns may be different pattern to pattern.

A pair of dummy patterns DM sandwich each actual pattern AC from both sides along one direction. That is, one dummy pattern DM of the pair is located on each side of the plurality of actual patterns AC in one direction. A plurality of dummy patterns DM can be located between otherwise adjacent actual patterns AC. Each of the dummy patterns DM is a convex pattern having a convex shape and can be located over the entire surface of the mesa portion MS (except for the positions where the actual patterns AC are located) with a predetermined interval from each other.

(Semiconductor Device Manufacturing Method)

Hereinafter, with reference to FIGS. 4A to 6F, an example of a method of manufacturing the semiconductor device MDV including the imprint process in the imprint apparatus 1 described above is described.

FIGS. 4A to 6F are cross-sectional views sequentially illustrating a part of a procedure of the method of manufacturing the semiconductor device MDV according to Embodiment 1. The processes illustrated in FIGS. 4A to 6F are also a pattern forming method including the imprint process using the template 10.

Figure 4A:
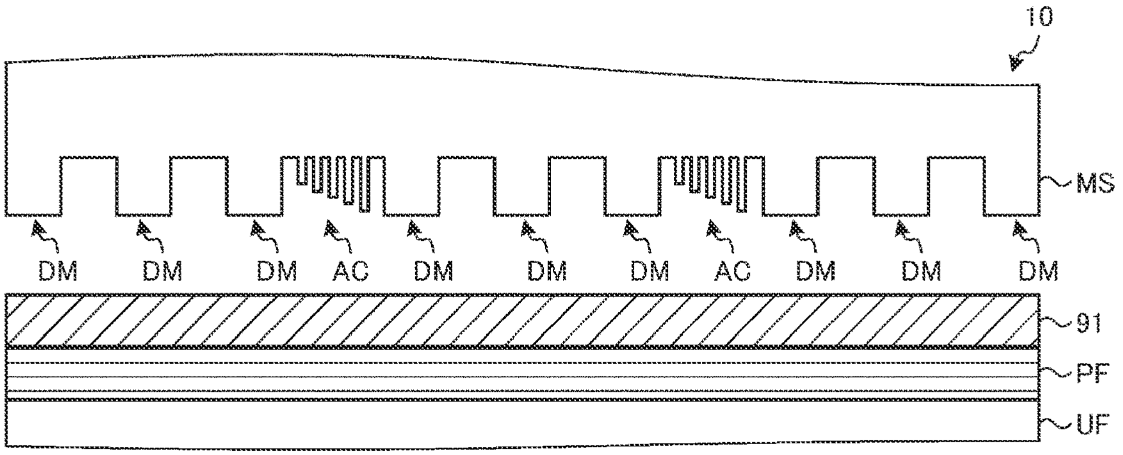
FIGS. 4A to 4C are cross-sectional views sequentially illustrating a part of a procedure of a semiconductor device manufacturing method according to Embodiment 1.

As illustrated in FIG. 4A, a film to be processed (process film PF) is formed on a base film UF. The base film UF is the insulating film 51 covering the peripheral circuit CUA in the semiconductor device MDV described above, the source line SL formed on the insulating film 51, and the like. The process film PF is, for example, a multilayer film obtained by alternately stacking a plurality of nitride layers and oxide layers. In the process film PF, the nitride layer is later replaced with a tungsten layer or the like, to become the stacked body LM of the semiconductor device MDV described above.

A resist film 91 is formed on the process film PF. The resist film 91 is, for example, a photocurable resin film or the like and is formed by applying a resist material onto the process film PF using, for example, a spin coating method or the like.

At this time, the resist film 91 is formed, for example, so as to cover the entire region on the process film PF to which the actual patterns AC and the dummy patterns DM in the mesa portion MS of the template 10 are transferred. The resist film 91 is in an uncured state at this stage.

The process of forming the resist film 91 as described above may be performed by another device such as a chemical liquid coating device, for example, before the wafer 30 is loaded into the imprint apparatus 1.

In order to transfer the plurality of columnar-shaped patterns CL of the template 10 onto the resist film 91, the surface on which the columnar-shaped patterns CL are formed faces the process film PF and thus the resist film 91 thereon.

Figure 4B:
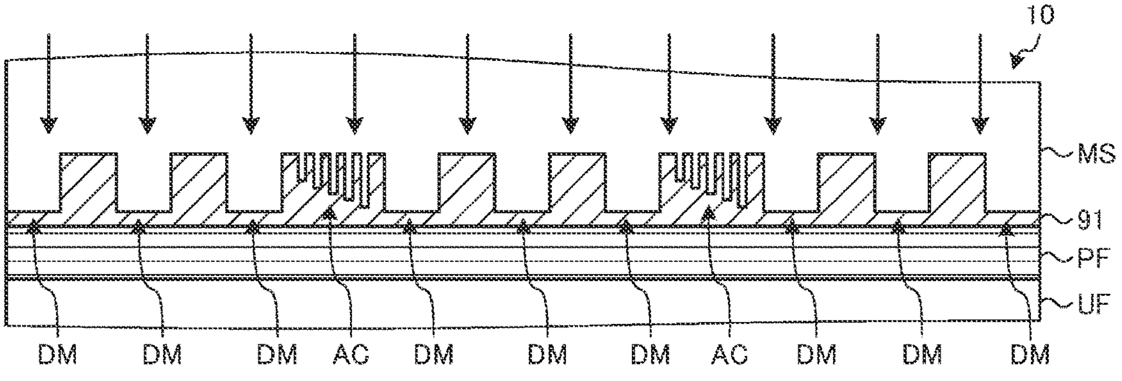

As illustrated in FIG. 4B, the columnar-shaped patterns CL of the template 10 are pressed against the resist film 91 on the process film PF. At this time, a slight gap is left between the process film PF and the columnar-shaped patterns CL having the largest protrusion amount so that the mesa portion MS of the template 10 does not come into contact with the process film PF.

By maintaining this state for a predetermined period of time, the resist film 91 penetrates between the plurality of columnar-shaped patterns CL and between the plurality of dummy patterns DM. After the resist film 91 spreads between the columnar-shaped patterns CL and between the dummy patterns DM, while the template 10 is pressed against the resist film 91, the resist film 91 is irradiated with light such as ultraviolet light through the template 10. Accordingly, the resist film 91 is cured.

Figure 4C:
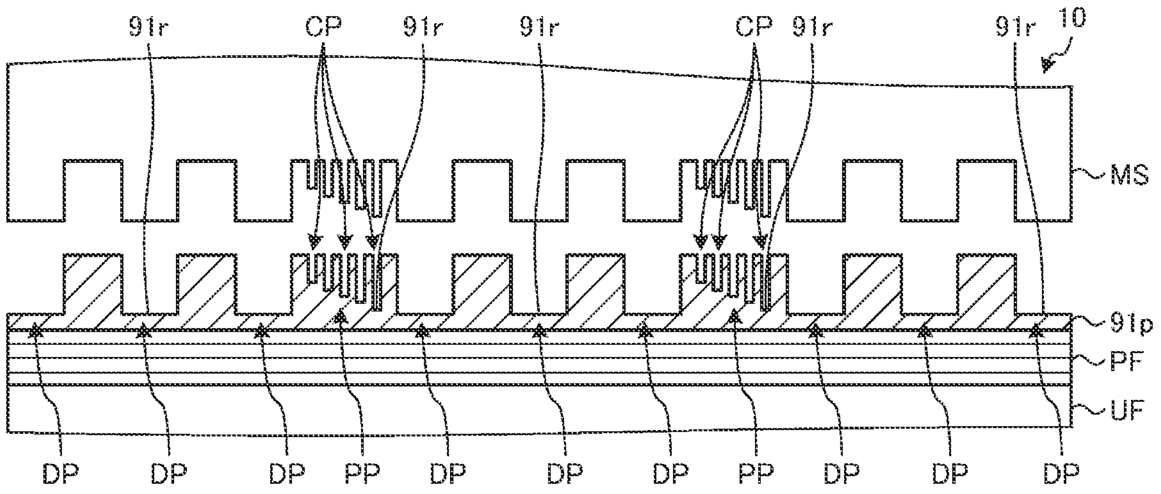

As illustrated in FIG. 4C, when the template 10 is released from a mold, a resist pattern 91*p* having a contact surface of the template 10 with the reference plane RP as the upper surface is formed. A plurality of contact patterns PP and a plurality of recess patterns DP are formed on the contact surface of the resist pattern 91*p*.

The contact patterns PP correspond in position to the actual patterns AC of the template 10 are transferred (imprinted) versions of the actual patterns AC. The plurality of contact patterns PP are separated from each other in the same manner as the actual patterns AC, and each contact pattern PP has a plurality of hole patterns CP corresponding in position to the columnar-shaped patterns CL of the template 10. The contact pattern CP has pattern features with different depths That is, contact pattern CP is a multi-depth pattern or pattern with multi-depth portions.

The plurality of recess patterns DP correspond in position to the dummy patterns DM are transferred (imprinted) versions of the dummy patterns DM and thus have recessed (concave) shapes. The recess patterns DP are single depth patterns. The plurality of recess patterns DP sandwich the plurality of contact patterns PP and are located between the plurality of contact patterns PP.

As described above, the resist film 91 is cured while a gap exists between the template 10 and the process film PF, and thus the resist pattern 91*p* has residual resist films 91*r* in bottom portions of the deepest hole patterns CP of the hole patterns CP. Similarly, the resist pattern 91*p* has the residual resist films 91*r* in the bottom portions of the recess patterns DP.

In a photolithographic technique, it is difficult to collectively (simultaneously) form resist patterns with different reaching depths into the resist film, such as like the resist pattern 91*p*. For this reason, a process cycle of repeating formation of a resist film, exposure and development, and processing of a film (a process film) several times is required to achieve similar multi-depth patterning.

However, according to the technique using the template 10, a plurality of patterns having different reaching depths in the resist film 91 are formed by one imprint process on the resist film 91.

Figure 5A:
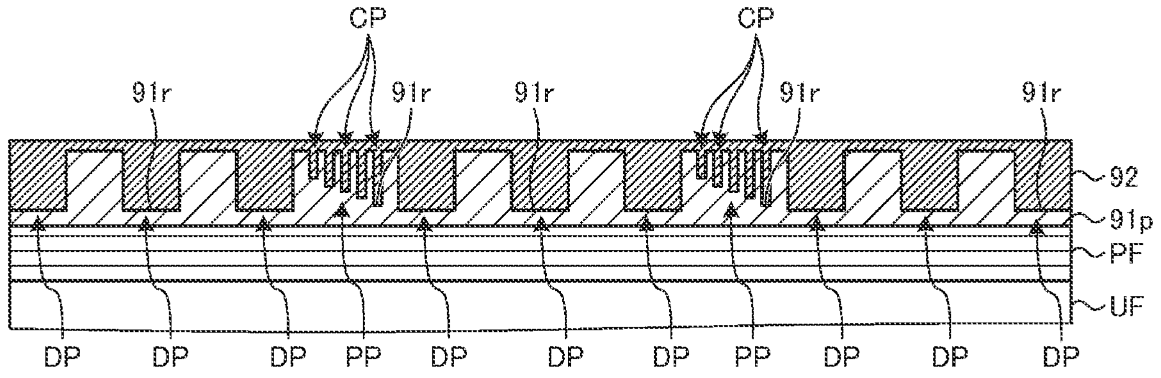
FIGS. 5A to 5C are cross-sectional views sequentially illustrating a part of the procedure of the semiconductor device manufacturing method according to Embodiment 1.

As illustrated in FIG. 5A, a resist film 92 covers the resist pattern 91*p*. The resist film 92 is a photosensitive positive (positive tone) resist film or the like that can be used in photolithography and is formed by coating the resist pattern 91*p* with a positive resist material by using a spin coat method or the like.

The resist film 92 may also be formed by a device other than the imprint apparatus 1, such as a chemical liquid coating device. In this case, the wafer 30 on which the resist pattern 91*p* is formed can be unloaded from the imprint apparatus 1 and then loaded into the light exposure device after the resist film 92 is formed by the chemical liquid coating device. In addition, before the resist film 92 is formed, the front surface of the resist pattern 91*p* may be subjected to surface treatment such as a vacuum ultraviolet (VUV) process.

Figure 5B:
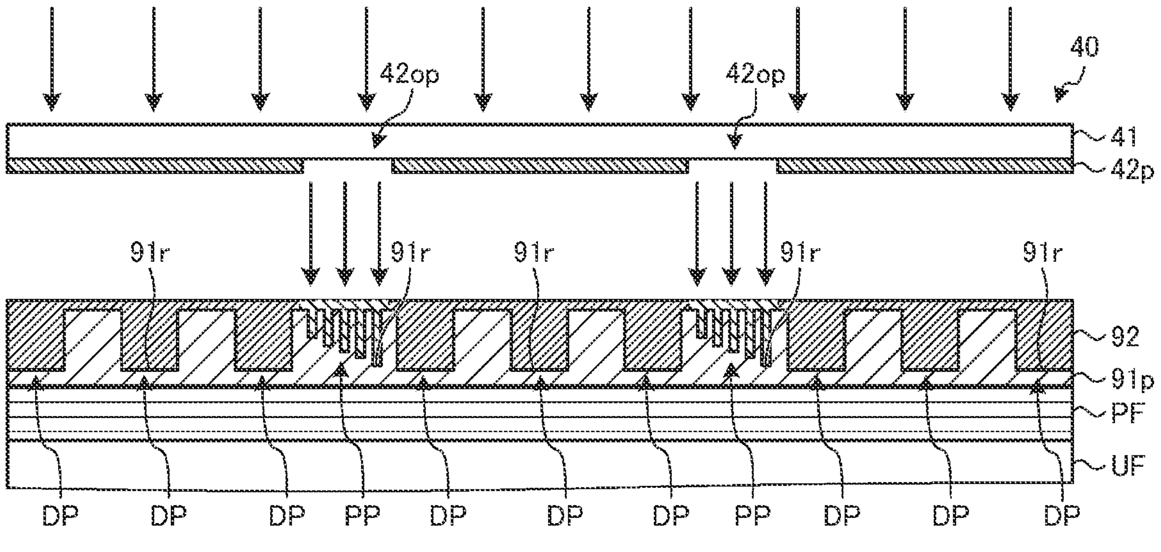

As illustrated in FIG. 5B, a photomask 40 faces the resist film 92 in order to expose a part of the resist film 92. The photomask 40 includes a transparent substrate 41 and a light shielding film pattern 42*p*.

The light shielding film pattern 42*p* has a plurality of openings 42*op*. The plurality of openings 42*op* are located at positions vertically overlapping with the plurality of contact patterns PP formed on the resist pattern 91*p* on the process film PF. The plurality of openings 42*op* are larger than the regions in which the plurality of contact patterns PP are formed, and the individual contact patterns PP entirely fall in a position below the openings 42*op*.

With the photomask 40 facing the resist film 92, the resist film 92 is irradiated with exposure light that passes through the openings 42*op* of the photomask 40. As a result, portions of the resist film 92 that cover the plurality of contact patterns PP are exposed.

Figure 5C:
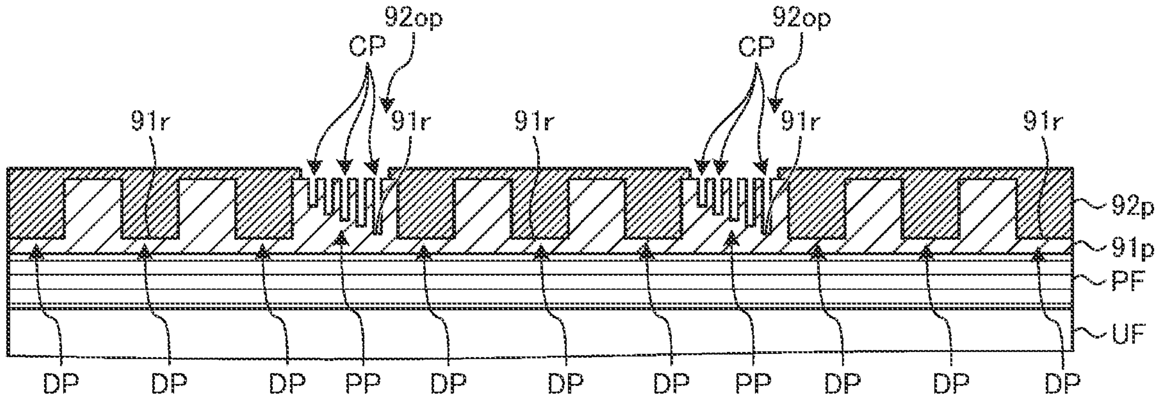

As illustrated in FIG. 5C, by developing the selectively exposed resist film 92, a resist pattern 92*p* having openings 92*op* at positions overlapping the contact patterns PP of the resist pattern 91*p* is formed. As a result, the contact patterns PP of the resist pattern 91*p* covered with the resist film 92 are exposed from the openings 92*op* of the resist pattern 92*p*.

Figure 6A:
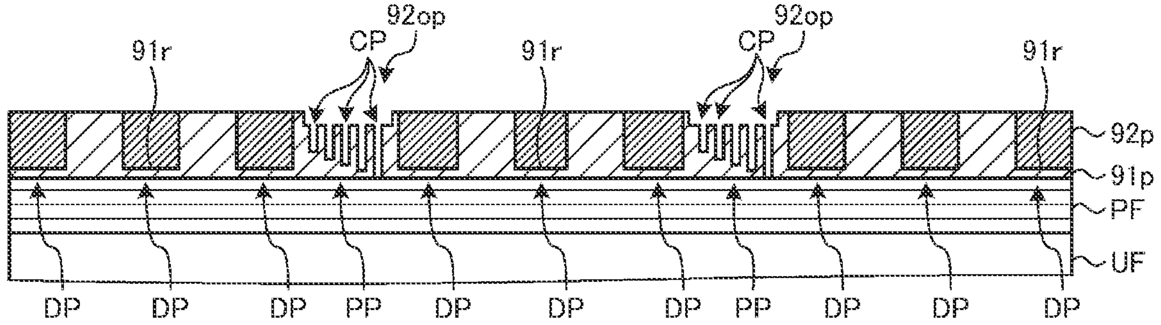
FIGS. 6A to 6F are cross-sectional views sequentially illustrating a part of the procedure of the semiconductor device manufacturing method according to Embodiment 1.

As illustrated in FIG. 6A, by using oxygen plasma or the like, the residual resist films 91*r* of the bottom portions of the deepest hole patterns CP can be removed. As a result, the upper surface of the process film PF can be exposed in the bottom portions of the deepest hole patterns CP. Also, in such a process, the film thicknesses of the resist patterns 91*p* and 92*p* are reduced as a whole.

Figure 6B:
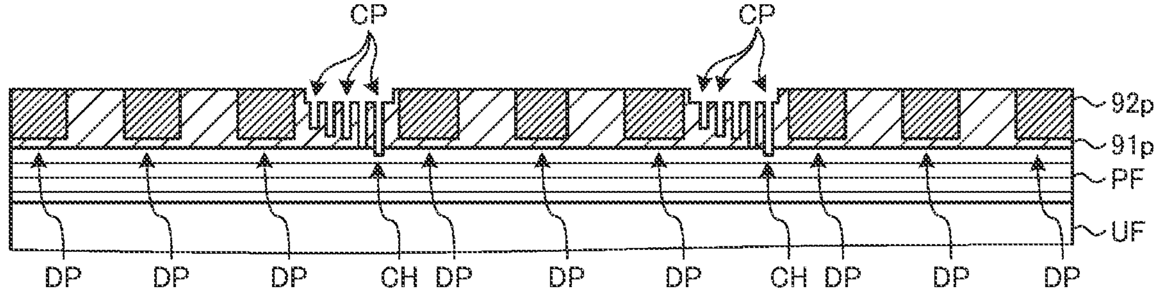

As illustrated in FIG. 6B, the process film PF is processed via the resist patterns 91*p* and 92*p*. As a result, the process film PF exposed from the resist pattern 91*p* is removed, and contact holes CH to which the deepest hole patterns CP are transferred are formed.

Further, the film thickness of the resist pattern 91*p* is reduced by using oxygen plasma or the like to remove the residual resist films 91*r* in the bottom portions of the hole patterns CP adjacent to the deepest hole patterns CP, so that the process film PF is newly exposed. At this time, the film thickness of the resist pattern 92*p* is also reduced together with the resist pattern 91*p*.

Figure 6C:
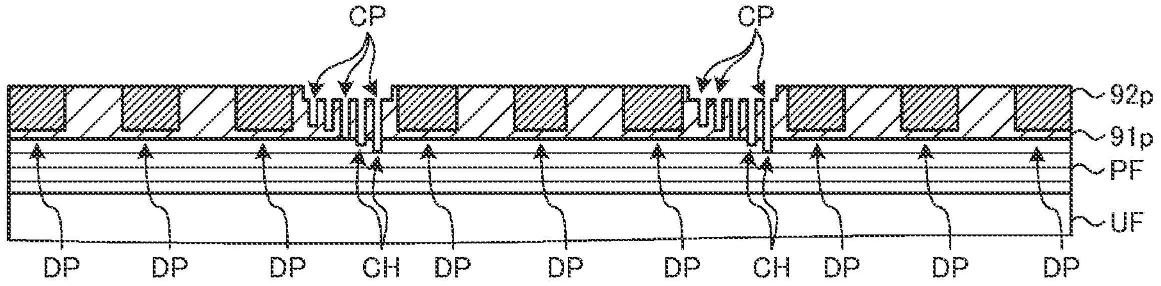

As illustrated in FIG. 6C, the processing of the process film PF is further continued via the resist patterns 91*p* and 92*p*. As a result, the upper surface of the process film PF newly exposed from the resist pattern 91*p* is removed, and thus the new contact hole CH is formed. The reaching depths of the existing contact holes CH in the process film PF are further increased.

Further, the film thickness of the resist pattern 91*p* is reduced by using oxygen plasma or the like to newly expose the process film PF from the bottom portion of the hole pattern CP adjacent to the newly formed contact hole CH.

Figure 6D:
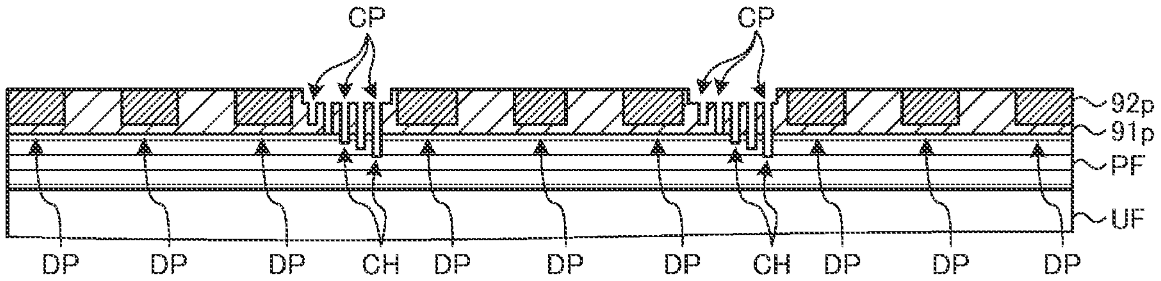

As illustrated in FIG. 6D, processing of the process film PF via the resist patterns 91*p* and 92*p* and film reduction of the resist patterns 91*p* and 92*p* by oxygen plasma or the like are further continued. As a result, the upper surface of the process film PF newly exposed from the resist pattern 91*p* is removed to form the new contact hole CH. The reaching depths of the contact holes CH in the process film PF further increase.

Figure 6E:
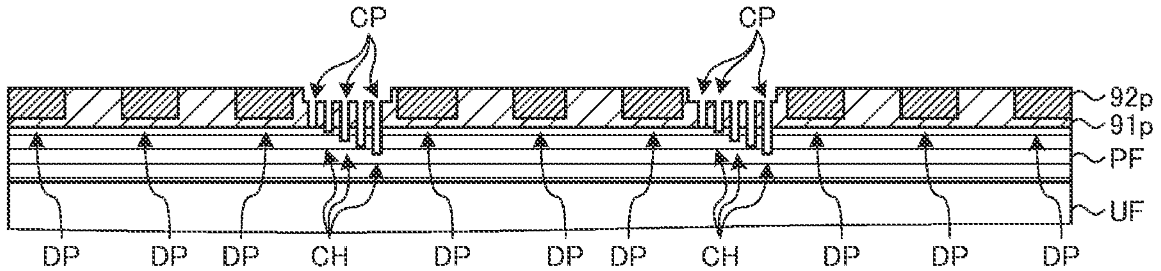

As illustrated in FIG. 6E, processing of the process film PF via the resist patterns 91*p* and 92*p* and film reduction of the resist patterns 91*p* and 92*p* by oxygen plasma or the like are further continued. As a result, the reaching depths of the contact holes CH to the process film PF are further increased, and also the process film PF is newly exposed from the bottom portions of the hole patterns CP in an order of depths of the hole patterns CP transferred by the template 10, so that the new contact hole CH is formed.

Figure 6F:
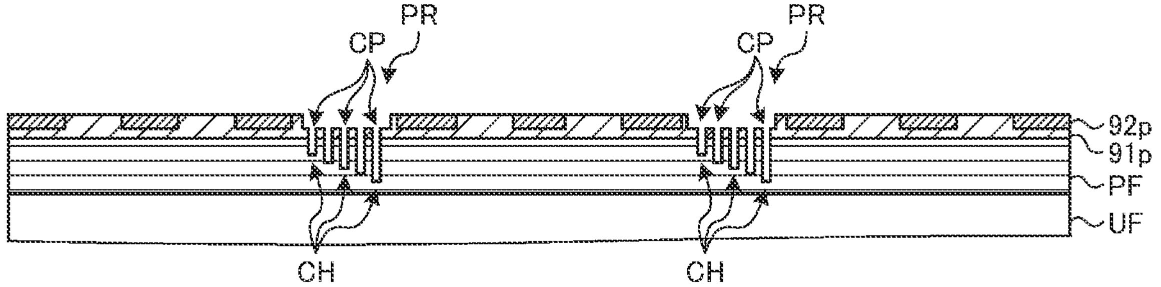

As illustrated in FIG. 6F, by continuing the processing as described above, contact holes CH having different reaching depths are formed in the process film PF. However, the plurality of recess patterns DP are not transferred to the process film PF.

In this manner, the region where the plurality of contact holes CH are formed becomes the contact region PR (see FIGS. 1A and 1B) in the semiconductor device MDV described above. Thereafter, the remaining resist patterns 91*p* and 92*p* are removed.

With the above, the pattern forming process using the template 10 is completed.

In the above imprint process, for example, when the rectangular columnar-shaped pattern CL of the template 10 is transferred to the resist film 91, the columnar-shaped pattern CL may be transferred into a shape in which the corner portions are rounded. Further, when the plurality of contact holes CH are formed in the process film PF by using the resist pattern 91*p*, the corner portions of the contact holes CH may be processed to be further rounded.

Further, in the above example of FIGS. 6A to 6F, the removal rates of the resist patterns 91*p* and 92*p* during processing on the process film PF are assumed to be substantially equal. However, if both the resist patterns 91*p* and 92*p* remain until the plurality of contact holes CH are completed, the removal rates may not be equal. That is, for example, after the plurality of contact holes CH are formed, a residual film of one of the resist patterns 91*p* and 92*p* may be thinner than a residual film of the other.

Thereafter, the pillars PL (see FIGS. 1A and 1B) for forming memory cells MC are formed between the plurality of contact regions PR formed in the process film PF. Further, the stacked body LM in which the plurality of word lines WL and the plurality of insulating layers OL are alternately stacked is formed by performing a replacement process of replacing the silicon nitride layer of the process film PF having a multilayer structure with the word lines WL of tungsten layers or the like.

Further, the contacts CC respectively connected to the word lines WL at different depths are formed by covering the sidewalls of the plurality of contact holes CH formed using the template 10 with an insulating layer and then filling with a metal layer.

As described above, the contact holes CH formed in the stacked body LM each have, for example, a shape in which the corner portions are rounded by the processes illustrated in FIGS. 4A to 6F. For this reason, when metal layers are embedded in the contact holes CH to function as the contacts CC, power concentration (electric field concentration) or the like that might otherwise be caused at sharp corners of a contact CC having an acute-angled portion can be avoided.

As described above, the semiconductor device MDV of Embodiment 1 is manufactured.

(Template Manufacturing Method)

Next, with reference to FIGS. 7A to 10C, a method of manufacturing the template 10 described above and a master template 10*m* used in the manufacturing of the template 10 is described.

As described above, when the template 10 is to be manufactured, a master template 10*m* is first manufactured to be used as the original plate (master template) for the template 10. A plurality of templates 10 having the same configuration can be manufactured from one master template 10*m*.

FIGS. 7A to 7E are cross-sectional views illustrating a part of the procedure of the method of manufacturing the master template 10*m* according to Embodiment 1. FIGS. 7A to 7E are partially enlarged cross-sectional views of the mesa portion of the master template 10*m* during the manufacturing.

Figure 7A:
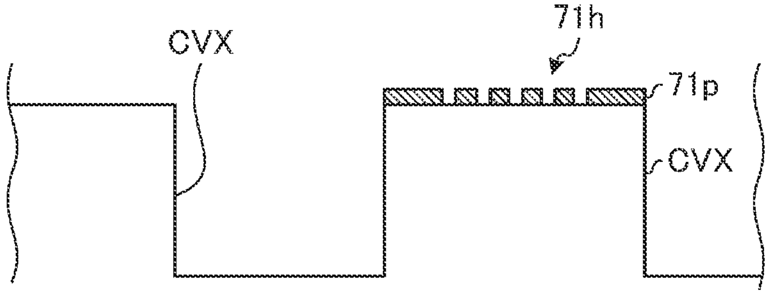
FIGS. 7A to 7E are cross-sectional views illustrating a part of a procedure of a master template manufacturing method according to Embodiment 1.

As illustrated in FIG. 7A, a plurality of convex patterns CVX are formed on the mesa portion projecting to the front surface of the transparent substrate of the master template 10*m*. Further, among the convex patterns CVX, the upper surfaces of the convex patterns CVX at positions separated from each other are covered with a mask film such as a chromium film to form a mask pattern 71*p* having a plurality of hole patterns 71*h*. At this time, the mesa portion including other convex patterns CVX or the entire upper surface of the transparent substrate may be covered with a mask film such as a chromium film.

The mesa portion of the transparent substrate is formed, for example, by grinding a transparent substrate by machine processing. The convex pattern CVX of the mesa portion is formed by laser processing or etching processing using a mask film or the like. The hole patterns 71*h* can be formed by processing a mask film by an electron drawing technique using an electron beam or the like.

Figure 7B:
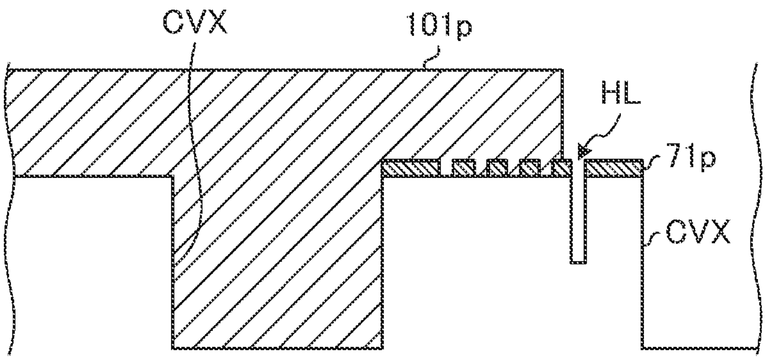

As illustrated in FIG. 7B, a resist pattern 101*p* that partially covers the mask pattern 71*p* partially covers the plurality of convex patterns CVX. The resist pattern 101*p* is formed, for example, by coating a transparent substrate with a resist film such as a photosensitive organic film and exposing a part thereof to light.

At this time, among these convex patterns CVX, the ends of the convex patterns CVX, on which the mask pattern 71*p* is formed, on the side away from each other are exposed.

That is, in FIG. 7B, another projecting pattern CVX on which the mask pattern 71*p* is formed is positioned at a position where the projecting pattern CVX on which the mask pattern 71*p* is formed is separated to the left side of the drawing. Further, the right end portion of the drawing of the convex pattern CVX on which the mask pattern 71*p* is formed in FIG. 7B is left exposed from the resist pattern 101*p*.

The convex pattern CVX is processed via the mask pattern 71*p* exposed from the resist pattern 101*p* to form a hole pattern HL reaching a predetermined depth of the convex pattern CVX.

Figure 7C:
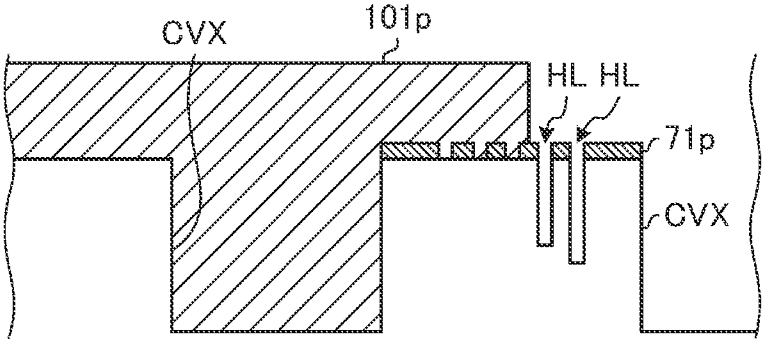

As illustrated in FIG. 7C, the resist pattern 101*p* is slimmed (narrowed) by oxygen plasma exposure (isotropic etching) or the like. As a result, the end portion of the resist pattern 101*p* on the mask pattern 71*p* recedes, and the mask pattern 71*p* on the convex pattern CVX is further exposed.

Further, the hole pattern HL reaching a predetermined depth of the convex pattern CVX is newly formed by processing the convex pattern CVX via the mask pattern 71*p* exposed from the resist pattern 101*p*. Also, at this time, the already formed hole pattern HL is processed deeper. As a result, hole patterns HL having different reaching depths in the convex pattern CVX are formed.

Figure 7D:
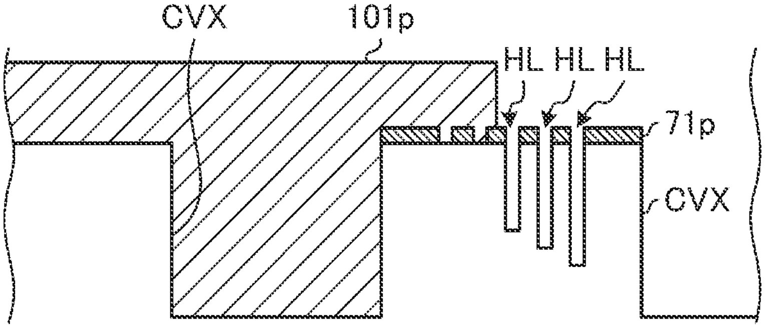

As illustrated in FIG. 7D, the mask pattern 71*p* is further exposed by slimming the resist pattern 101*p* by oxygen plasma or the like and causing the end portion of the resist pattern 101*p* to further recede.

Further, a hole pattern HL reaching the predetermined depth of the convex pattern CVX is newly formed by processing the convex pattern CVX via the mask pattern 71*p* exposed from the resist pattern 101*p*. Also, at this time, the hole patterns HL that are already formed are processed deeper to form hole patterns HL with reaching depths in the convex pattern CVX that are sequentially increased.

Figure 7E:
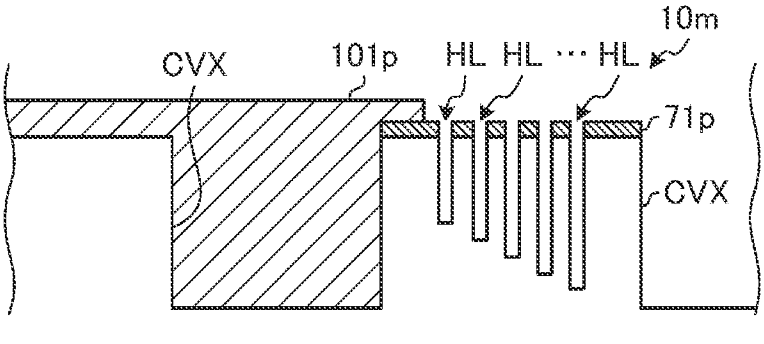

As illustrated in FIG. 7E, the plurality of hole patterns HL with reaching depths in the convex pattern CVX that sequentially increase are formed by repeating the slimming of the resist pattern 101*p* and processing of the convex patterns CVX. By this process, the master template 10*m* is manufactured. Thereafter, the remaining resist pattern 101*p* and the mask pattern 71*p* are removed. The template 10 can be manufactured by performing an imprint process using the master template 10*m* manufactured in this manner.

In the above description, the hole patterns 71*h* of the mask pattern 71*p* are sequentially exposed by causing the end portion of the same resist pattern 101*p* to recede by slimming. However, in other examples, whenever one hole pattern 71*h* is to be exposed to form a new hole pattern HL, the already formed resist pattern 101*p* can be removed by asking to permit a new resist pattern 101*p* to be formed and the end portion (edge) of this new resist pattern 101*p* can be processed or positioned to expose a position where the next hole pattern 71*h* is to be formed.

When the processing of the resist pattern 101*p* with high accuracy by slimming is difficult, formation of hole patterns HL can be generally be performed with higher accuracy by repeatedly performing exposure and development of resist patterns 101*p* instead of slimming of a single resist pattern 101*p*.

FIGS. 8A to 10C are cross-sectional views sequentially illustrating a part of the procedure of the method of manufacturing the template 10 according to Embodiment 1. FIGS. 8A to 10C are partially enlarged cross-sectional views of the mesa portion MS of the template 10 during the manufacturing.

Figure 8A:
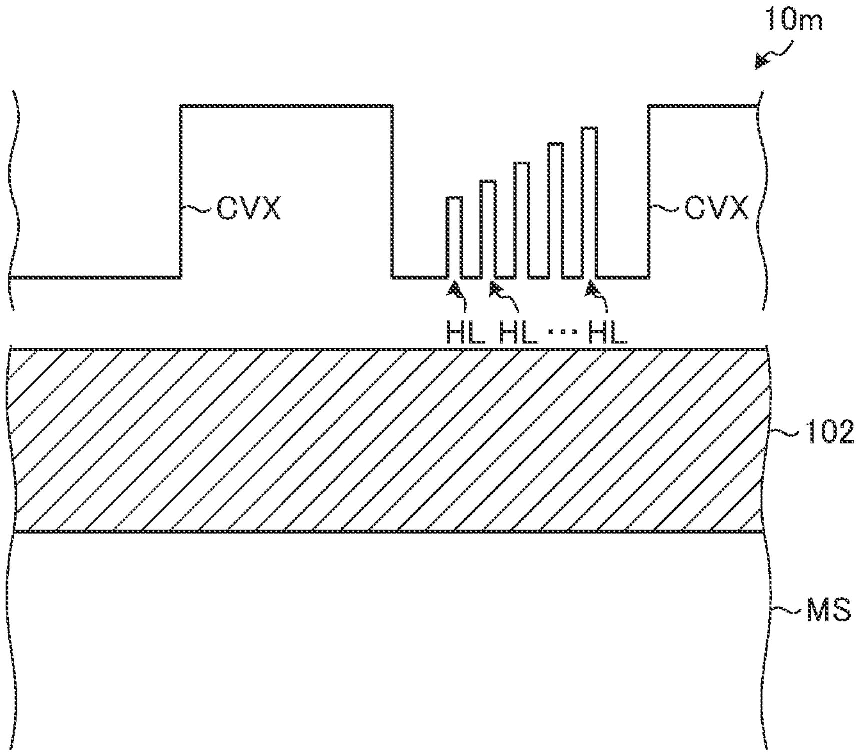
FIGS. 8A and 8B are cross-sectional views sequentially illustrating a part of a procedure of a template manufacturing method according to Embodiment 1.

As illustrated in FIG. 8A, the upper surface of the mesa portion MS is covered with a resist film 102 by forming the mesa portion MS protruding to the front surface of the transparent substrate BA of the template 10 (see FIG. 3B). Also, at this time, the entire upper surface of the transparent substrate BA except for the mesa portion MS may be covered with a mask film such as a chromium film.

The mesa portion MS of the transparent substrate BA is formed, for example, by grinding the transparent substrate BA by machine processing, as in the case of the master template 10*m* described above. The resist film 102 is, for example, a photocurable resin film or the like that can be cured by irradiation with ultraviolet rays or the like. The resist film 102 can be formed applying a resist material by spin coating or by dispensing the resist material by an inkjet method. At this time, after the initial coating/dispensing the resist film 102 is in an uncured state.

In order to transfer the convex pattern CVX and the hole pattern HL of the master template 10*m* to the resist film 102, the surface on which the convex pattern CVX and the hole pattern HL are formed faces the template 10 side to cause the master template 10*m* to face the resist film 102.

Figure 8B:
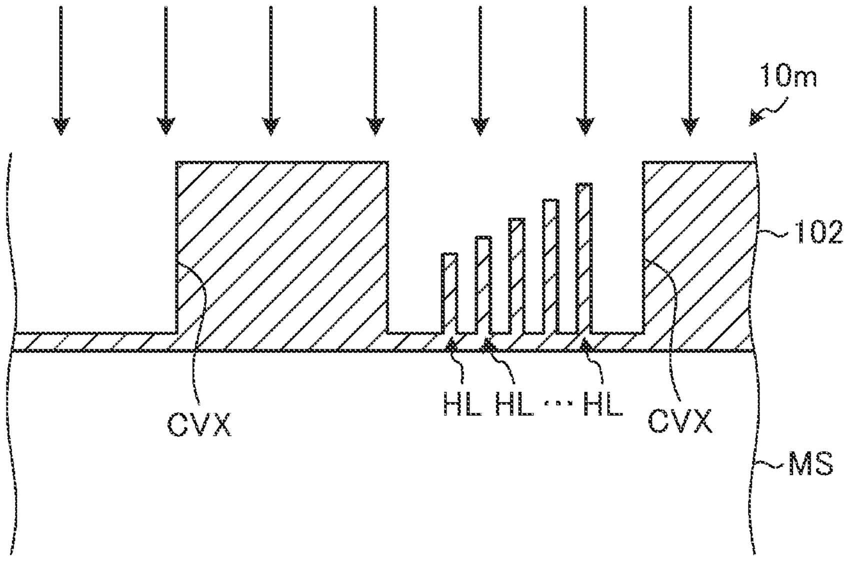

As illustrated in FIG. 8B, the hole pattern HL of the master template 10*m* is pressed against the resist film 102 on the mesa portion MS. At this time, a slight gap is provided between these mesa portions so that the mesa portion of the master template 10*m* does not come into contact with the mesa portion MS of the template 10.

As a result, a part of the resist film 102 is filled between the convex patterns CVX and inside the hole pattern HL of the master template 10*m*. In this state, when the resist film 102 is irradiated with light such as ultraviolet light passing through the master template 10*m* while the master template 10*m* is pressed against the resist film 102, the resist film 102 is cured.

Figure 9A:
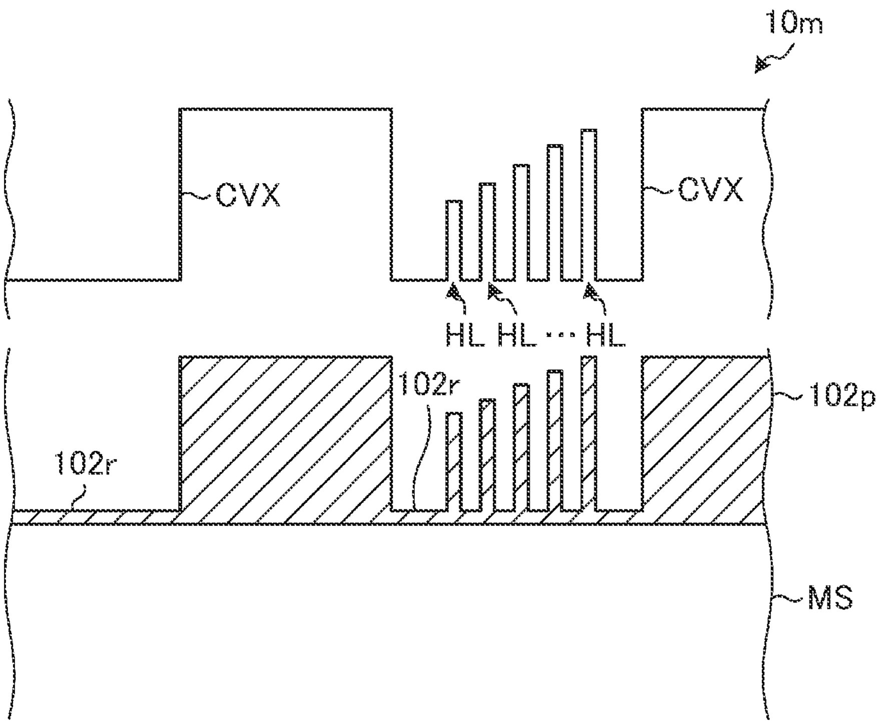
FIGS. 9A to 9C are cross-sectional views sequentially illustrating a part of a procedure of the template manufacturing method according to Embodiment 1.

As illustrated in FIG. 9A, when the master template 10*m* is released from the mold, a resist pattern 102*p* to which the convex pattern CVX and the hole pattern HL of the master template 10*m* are transferred is formed. As described above, since the resist film 102 is cured while a gap exists between the mesa portion of the master template 10*m* and the mesa portion MS of the template 10, the resist pattern 102*p* includes a residual resist film 102*r* that connects the bottom portions of each transferred pattern.

Figure 9B:
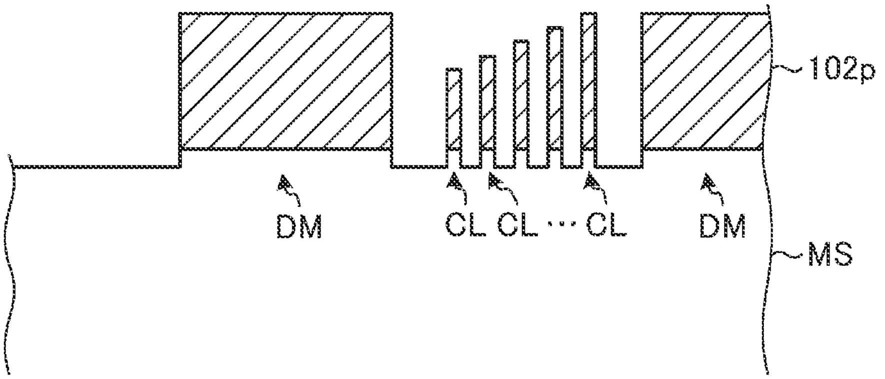

As illustrated in FIG. 9B, the residual resist film 102*r* on the bottom portions of each pattern is removed by using oxygen plasma or the like. Further, the mesa portion MS is processed via the resist pattern 102*p*. As a result, the film thickness of the resist pattern 102*p* is reduced, and also the upper surfaces of the mesa portions MS exposed from the resist pattern 102*p* are removed, so that the dummy patterns DM and the columnar-shaped patterns CL to which the resist pattern 102*p* is transferred are formed.

Figure 9C:
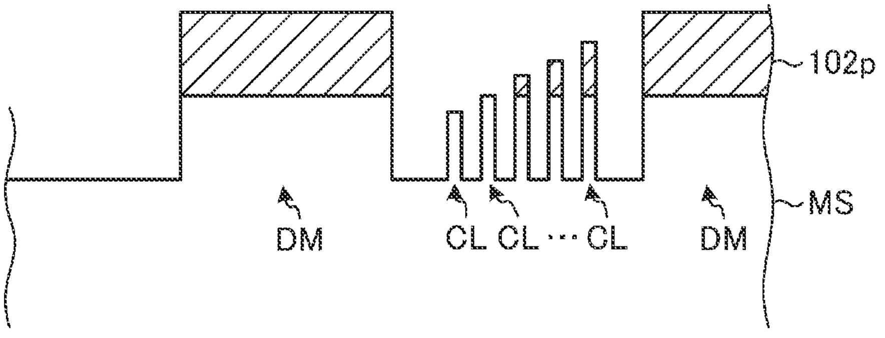

As illustrated in FIG. 9C, when the processing of the mesa portion MS via the resist pattern 102*p* is further continued, the resist pattern 102*p* having the thinnest film thickness on the columnar-shaped pattern CL disappears, and thus the upper end portion of the exposed columnar-shaped patterns CL is removed. As a result, the protrusion amount of the columnar-shaped pattern CL, from which the resist pattern 102*p* disappears, from the upper surface of the mesa portion MS is smaller than that of the other columnar-shaped pattern CL.

Thereafter, the processing of the mesa portion MS via the resist pattern 102*p* is further continued. As a result, the upper surface of the mesa portion MS exposed from the resist pattern 102*p* is further removed, and the protrusion amounts of the dummy patterns DM and the columnar-shaped patterns CL from the upper surface of the mesa portion MS relatively increase. Further, among the resist patterns 102*p* on the columnar-shaped patterns CLb, the resist pattern 102*p* having the next thinnest film thickness disappears.

In the columnar-shaped patterns CL from which the resist pattern 102*p* disappear first, the upper end portion is further removed, and the protrusion amount from the upper surface of the mesa portion MS becomes smaller than that of the other columnar-shaped patterns CL.

Figure 10A:
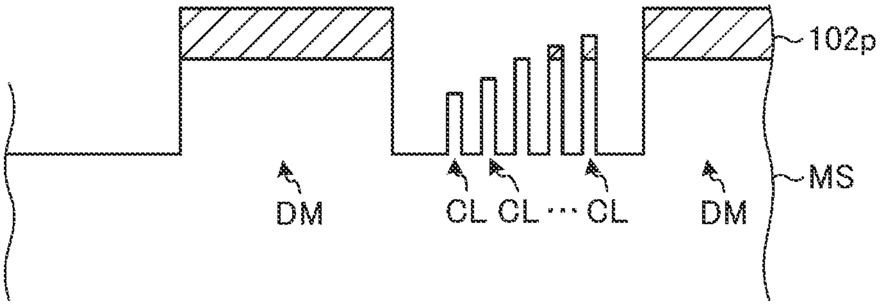
FIGS. 10A to 10C are cross-sectional views sequentially illustrating a part of the procedure of the template manufacturing method according to Embodiment 1.

As illustrated in FIG. 10A, the processing of the mesa portion MS is further continued via the resist pattern 102*p*. As a result, the upper surface of the mesa portion MS exposed from the resist pattern 102*p* is further removed, and the protrusion amounts of the dummy patterns DM and the columnar-shaped patterns CL from the upper surface of the mesa portion MS relatively increase. Further, among the resist patterns 102*p* on the columnar-shaped patterns CLb, the resist pattern 102*p* having the next thinnest film thickness disappears.

The upper end portion of the columnar-shaped patterns CL that are already exposed due to the disappearance of the resist pattern 102*p* are further removed, and the protrusion amount from the upper surface of the mesa portion MS becomes smaller than that of the other columnar-shaped patterns CL.

Figure 10B:
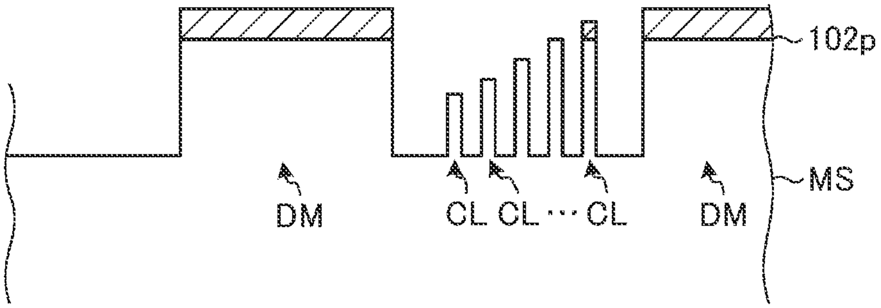

As illustrated in FIG. 10B, the processing of the mesa portion MS is further continued via the resist pattern 102*p*. As a result, the protrusion amounts of the dummy patterns DM and the columnar-shaped patterns CL from the upper surface of the mesa portion MS relatively increase, and also the resist pattern 102*p* on the columnar-shaped pattern CL disappears in the descending order of film thicknesses, so that the plurality of columnar-shaped patterns CL are sequentially exposed and removed.

Figure 10C:
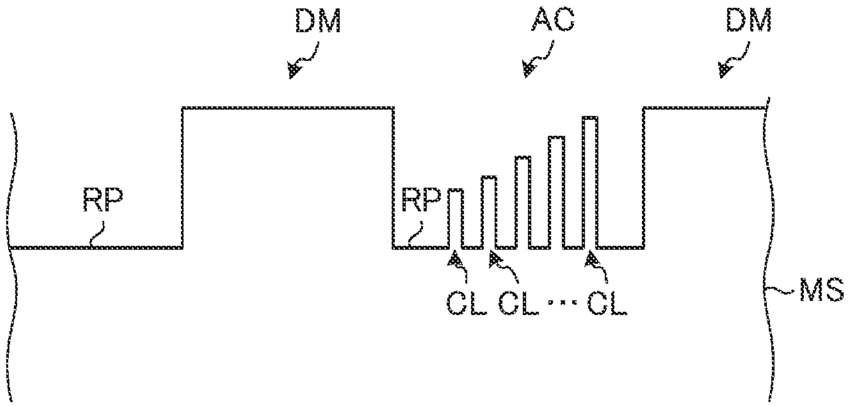

As illustrated in FIG. 10C, by continuing the processing as described above, the dummy patterns DM and the actual patterns AC protruding from the upper surface of the mesa portion MS are formed. The columnar-shaped patterns CL with protrusion amounts from the upper surface of the mesa portion MS which sequentially increase are formed in each of the actual patterns AC. The upper surface of the mesa portion MS exposed at this time corresponds to the reference plane RP described above.

With the above, the template 10 of Embodiment 1 is manufactured.

The method for manufacturing the template 10 described above is merely an example, and the template 10 of Embodiment 1 may be manufactured by a method other than the above. For example, the template 10 may be manufactured without using a master template 10*m*.

In such a case, the plurality of dummy patterns DM and the plurality of the columnar-shaped patterns CL may be directly drawn on the upper surface of the mesa portion MS of the transparent substrate BA by an electron beam or the like. Alternatively, the plurality of dummy patterns DM and the plurality of the columnar-shaped patterns CL may be formed by etching by using a mask pattern using a chromium film or the like and a resist pattern using a resist film or the like.

Comparative Example

In a semiconductor device manufacturing process, a plurality of contact holes having different reaching depths in a process film or a dual damascene structure in which vias and wiring are collectively formed may be formed. If these structures were to be formed by just using a photolithographic technique, the manufacturing process would be complicated and costly due to the need for repetition of the exposure and development of the resist film a plurality of times.

However, with an imprint process using a template, contact holes having different depths, a dual damascene structure, and the like can be formed in a single imprint process.

Figure 11A:
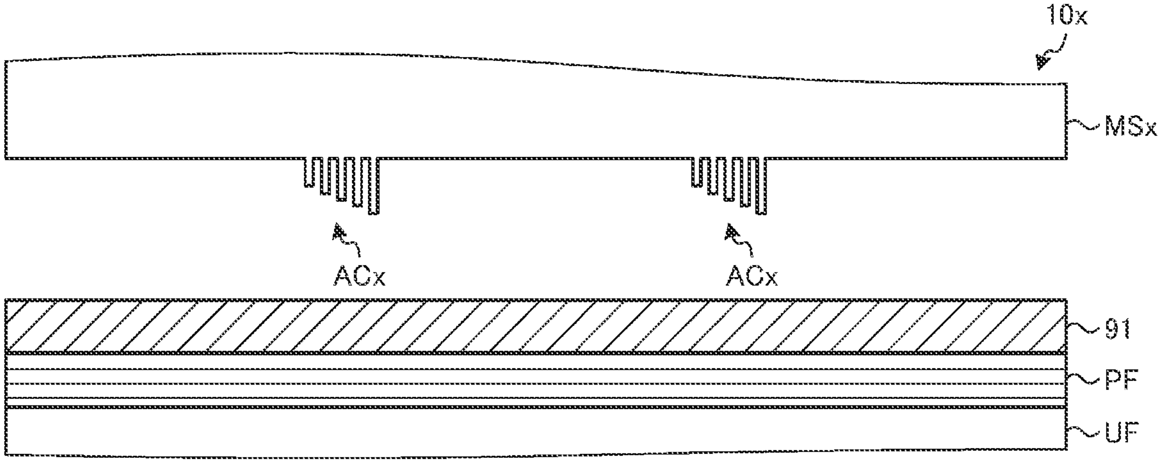
FIGS. 11A to 11C are cross-sectional views illustrating a part of the procedure of an imprint process using a template according to a comparative example.
Figure 11B:
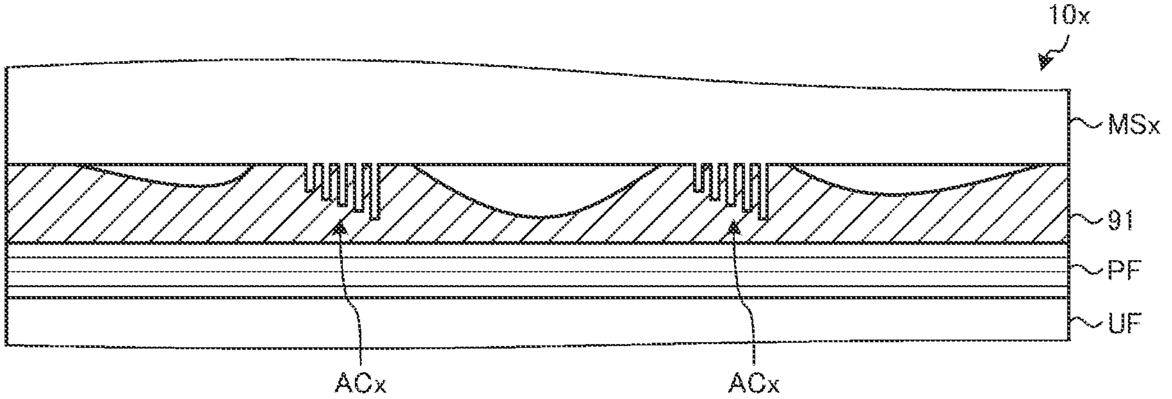
Figure 11C:
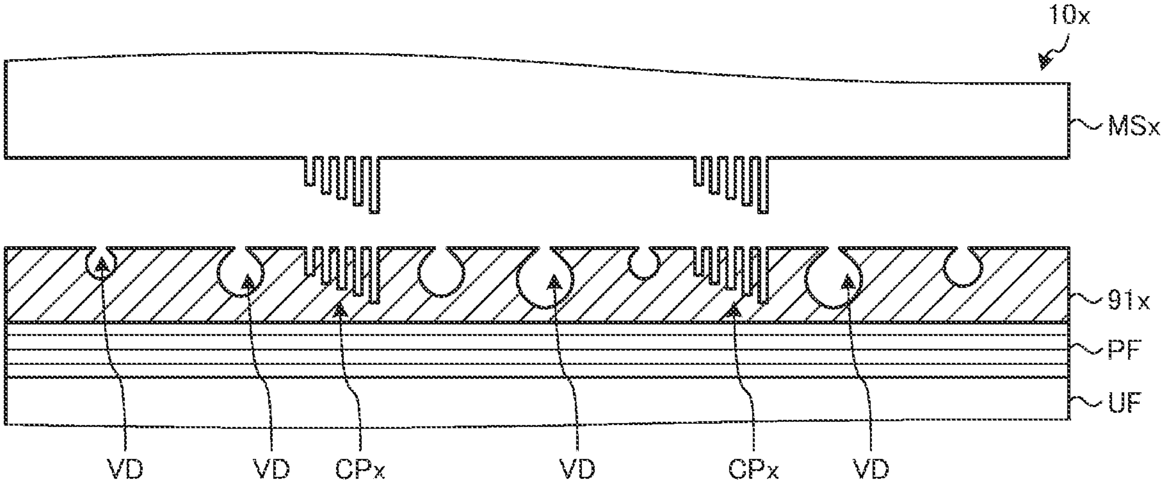

However, such an imprint process also has some problems. An example of the imprint process using a template 10*x* of the comparative example is described below with reference to FIGS. 11A to 11C. FIGS. 11A to 11C are cross-sectional views illustrating a part of the procedure of the imprint process using the template 10*x* according to the comparative example.

As illustrated in FIG. 11A, the template 10*x* according to the comparative example includes a plurality of actual patterns ACx protruding from a mesa portion MSx. The actual patterns ACx each have a plurality of columnar-shaped patterns therein. No other patterns (e.g., no dummy type patterns) are located between the plurality of actual patterns ACx.

In this way, the template 10*x* according to the comparative example has a configuration with a large difference between a dense region in which a plurality of actual patterns ACx are located and a sparse region in which no pattern is located, that is, a large pattern density difference between different regions.

As illustrated in FIG. 11B, when the template 10*x* according to the comparative example is pressed against the resist film 91, it requires a long period of time for the resist film 91 to penetrate (fill) the sparse regions between the actual patterns ACx. Furthermore, air bubbles may be trapped in the resist film 91 in contact with the sparse region of the template 10*x*.

In the imprint process, instead of the resist film 91, droplets of a resist material may be located on the process film PF by an inkjet method. In such imprint process using an inkjet method, air bubbles are trapped more easily.

As illustrated in FIG. 11C, when the resist film 91 is cured with air bubbles trapped in the sparse region of the template 10*x*, a resist pattern 91*x* including voids VD between the regions to which the plurality of actual patterns ACx are transferred is formed.

In this way, in the imprint process using the template 10*x* with a large pattern density difference, it requires time to fill the resist film 91, and the efficiency of the imprint process may be lowered. Further, a formation defect of the resist pattern 91*x* may occur. Further, in the template 10*x* with a large pattern density difference, there is also a drawback that the actual pattern ACx protruding from the mesa portion MSx is easily damaged.

In the pattern forming method according to Embodiment 1, the resist pattern 91*p* including the plurality of contact patterns PP separated in the direction along the contact surface of the template 10 of the resist film 91 with the reference plane RP and the recess patterns DP located between the plurality of contact patterns PP is formed, the resist film 92 that covers the resist pattern 91*p* is formed, the resist film 92 is exposed and developed, the plurality of contact patterns PP are exposed, the process film PF is processed via the resist patterns 91*p* and 92*p*, and the plurality of contact patterns PP are transferred to the process film PF.

In this way, by forming the recess patterns DP between the plurality of contact patterns PP, the pattern density difference of the template 10 is reduced. As a result, the time for filling the resist film 91 between the actual patterns AC of the template 10 is shortened, and the efficiency of the imprint process can be improved. Further, formation of voids or the like in regions between the plurality of contact patterns PP is prevented, and formation defects of the resist pattern 91*p* can be prevented.

By covering the recess pattern DP that does not contribute to the configuration of the semiconductor device MDV with the resist pattern 92*p*, the recess pattern DP can disappear without being transferred to the process film PF.

The template 10 includes the reference planes RP, the actual patterns AC protruding from the reference planes RP, and the plurality of dummy patterns DM that protrude from the reference planes RP and sandwich the actual patterns AC in the direction along the reference planes RP.

As a result, the actual patterns AC protruding from the reference planes RP can be protected by the dummy patterns DM, and damage to the actual patterns AC can be prevented. Therefore, the manufacturing cost of the semiconductor device MDV can be reduced by extending the lifespan of the template 10.

In Embodiment 1, as an example of a configuration having a highly advanced three-dimensional structure, an example in which a plurality of contacts CC respectively reaching word lines WL at different depths in the stacked body LM are formed in the semiconductor device MDV is described.

However, like a dual damascene structure DD or the like in which vias and wirings for electrically connecting the contacts C4 and the peripheral circuit CUA are collectively formed, the method according to Embodiment 1 can be applied to a configuration having a highly advanced three-dimensional structure in addition to the plurality of contacts CC.

For example, when the dual damascene structure DD in which vias and wirings for electrically connecting the contact C4 and the peripheral circuit CUA are collectively formed is formed by the imprint process, various processes described above can be performed by using the insulating film 51 of FIGS. 1A and 1B as the process film.

(Modification 1)

Figure 12A:
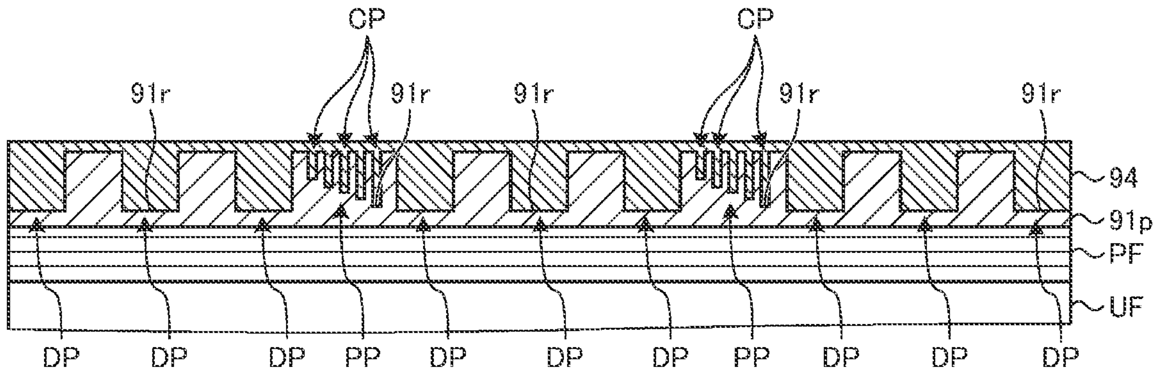
FIGS. 12A to 12C are cross-sectional views illustrating a part of a procedure according to a semiconductor device manufacturing method according to a Modification 1 of Embodiment 1.
Figure 12B:
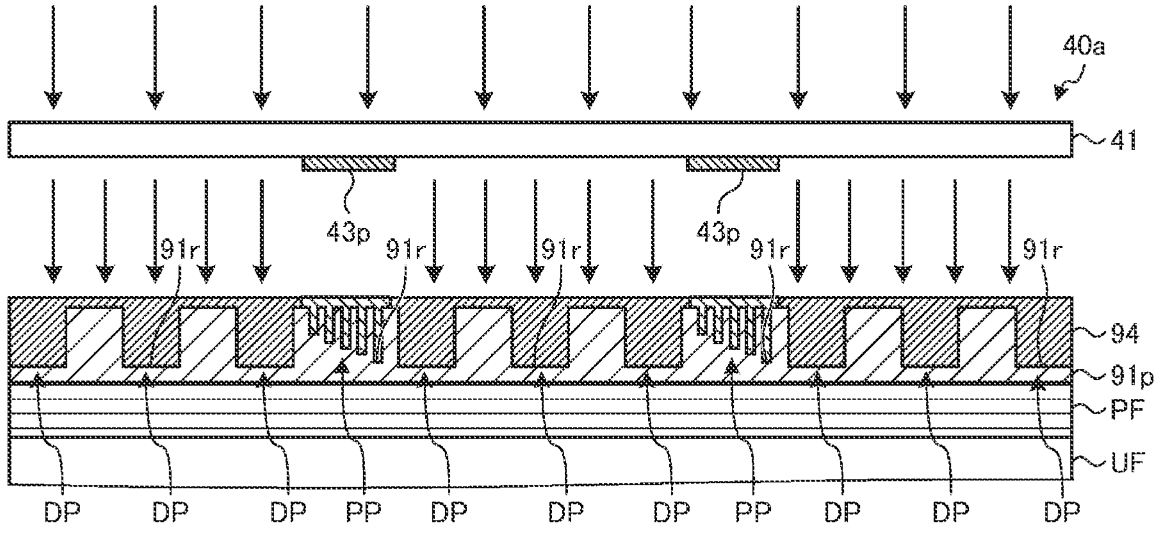
Figure 12C:
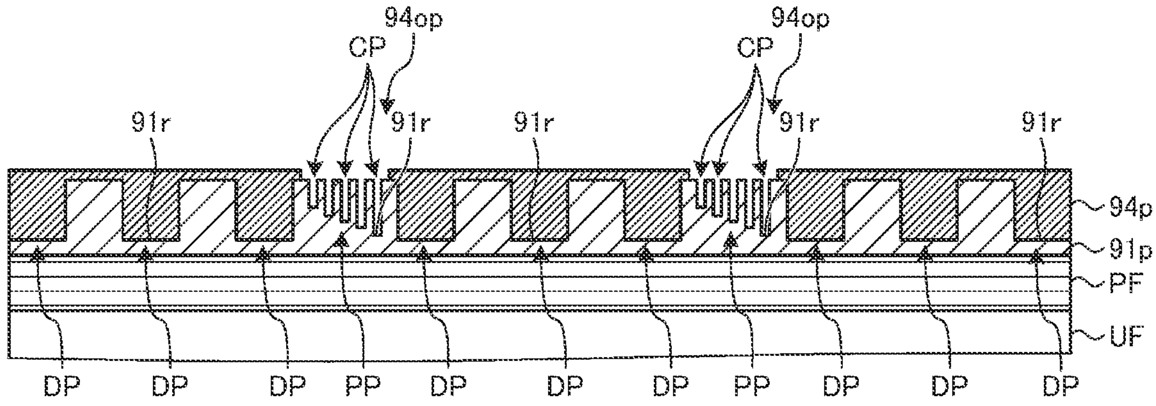

In Embodiment 1, after the resist pattern 91*p* is formed, the resist pattern 91*p* is covered with the positive resist film 92. However, instead of the positive resist film 92, a negative resist film may be used. FIGS. 12A to 12C illustrate an example of using a negative resist film.

FIGS. 12A to 12C are cross-sectional views illustrating a part of the procedure of the semiconductor device manufacturing method according to Modification 1 of Embodiment 1.

As illustrated in FIG. 12A, the resist pattern 91*p* in Modification 1 is formed like the process of FIG. 4 according to Embodiment 1 described above.

In the semiconductor device manufacturing method according to Modification 1, a negative resist film 94 that covers the resist pattern 91*p* is formed. The resist film 94 is a photosensitive negative resist film used in photolithography or the like and is formed by applying a negative resist material onto the resist pattern 91*p* by using a spin coat method or the like.

As illustrated in FIG. 12B, in order to expose a part of the resist film 94, a photomask 40*a* faces the resist film 94. The photomask 40*a* includes the transparent substrate 41 and a light shielding film pattern 43*p*. The light shielding film pattern 43*p* is located at a position vertically overlapped by the plurality of contact patterns PP formed in the resist pattern 91*p* on the process film PF.

With the photomask 40*a* facing the resist film 94, the light shielding film pattern 43*p* shields the plurality of contact patterns PP from light to selectively irradiate the resist film 94 by exposure light passing through the other portions of the photomask 40*a*. As a result, portions other than those that cover the plurality of contact patterns PP are exposed.

As illustrated in FIG. 12C, by developing the exposed resist film 94, a resist pattern 94*p* having openings 94*op* at a position overlapping with the contact patterns PP of the resist pattern 91*p* is formed. As a result, out of the resist pattern 91*p* covered with the resist film 94, the contact patterns PP are exposed.

Thereafter, for example, by performing the processes of FIGS. 6A to 6F according to Embodiment 1 and subsequent processes, the semiconductor device manufacturing method according to Modification 1 is completed.

By the pattern forming method according to Modification 1, the negative resist film 94 is exposed and developed to expose the plurality of contact patterns PP of the resist pattern 91*p*. At this time, unexposed portions of the negative resist film 94 are removed. Therefore, the resist film 94 that enters the bottom portions of the hole patterns CP as the deep holes can be removed without exposure. That is, the risk that the exposure light does not reach the bottom portions of the hole patterns CP can be avoided, and the resist film 94 can be exposed and developed more easily and more reliably.

In addition to the above, the pattern forming method according to Modification 1 exhibits the same effects as those of Embodiment 1 described above.

(Modification 2)

Next, a semiconductor device manufacturing method according to Modification 2 of Embodiment 1 is described with reference to FIGS. 13A to 15C. The semiconductor device manufacturing method according to Modification 2 is different from Embodiment 1 in that a pattern is also transferred between the plurality of contact regions PR of the process film PF.

FIGS. 13A to 15C are cross-sectional views sequentially illustrating a part of the procedure of the semiconductor device manufacturing method according to Modification 2 of Embodiment 1. The process illustrated in FIGS. 13A to 15C may be a pattern forming method including the imprint process using a template 11 as described below.

In this Modification 2, a semiconductor device MDV as illustrated in FIGS. 1A and 1B of Embodiment 1 is manufactured.

Figure 13A:
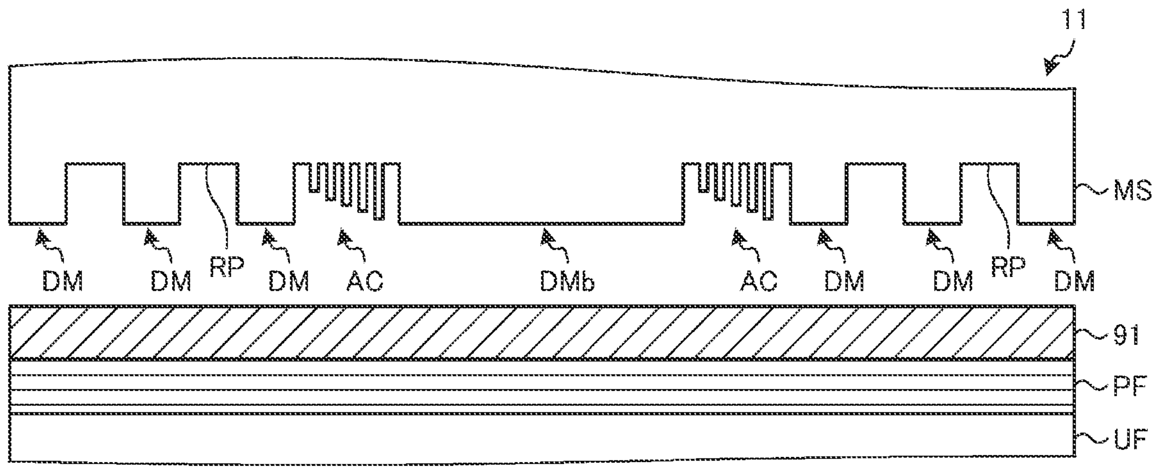
FIGS. 13A to 13C are cross-sectional views sequentially illustrating a part of a procedure according to a semiconductor device manufacturing method according to a Modification 2 of Embodiment 1.

As illustrated in FIG. 13A, the template 11 in this Modification 2 includes the plurality of actual patterns AC, a plurality of dummy patterns DM, and one dummy pattern DMb located between the plurality of actual patterns AC.

The dummy pattern DMb includes a convex pattern having a convex shape and occupies a larger area on the reference plane RP of the template 11 than the plurality of dummy patterns DM. As a result, the dummy pattern DMb is located across the region between the plurality of actual patterns AC.

Figure 13B:
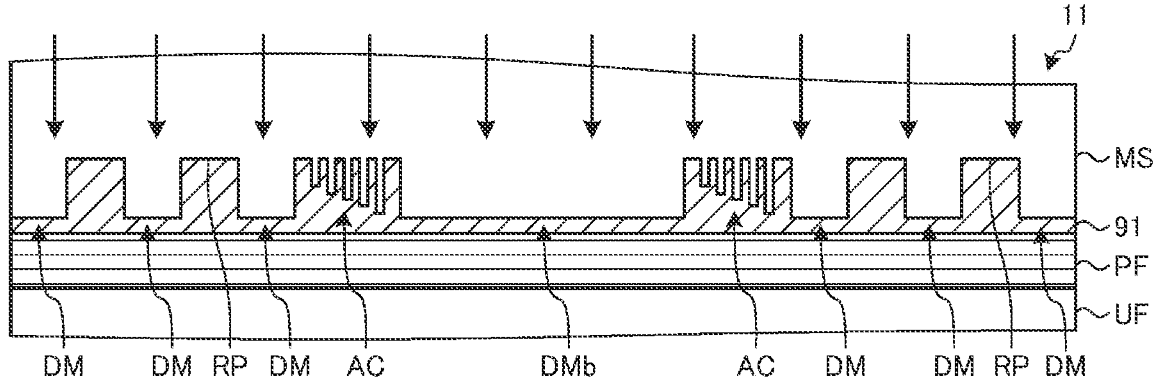

As illustrated in FIG. 13B, the actual patterns AC and the dummy patterns DM and DMb of the template 11 are pressed against the resist film 91 on the process film PF. After this state is maintained for a predetermined period of time, and the resist film 91 spreads between the actual patterns AC and the dummy patterns DM and DMb, the resist film 91 is irradiated with light such as ultraviolet light passing through the template 11 and cured.

Figure 13C:
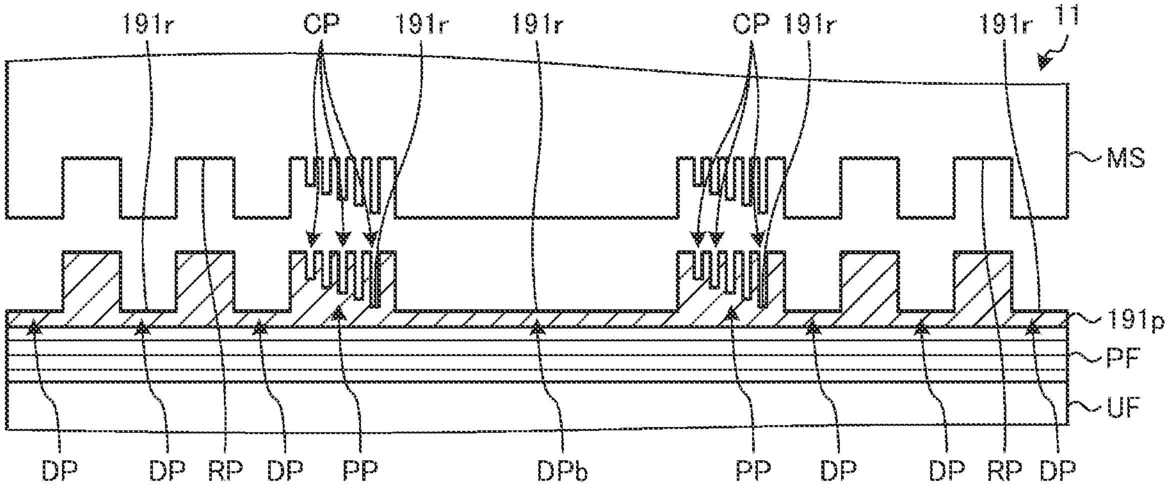

As illustrated in FIG. 13C, when the template 11 is released from the mold, the plurality of contact patterns PP, the plurality of recess patterns DP, and a resist pattern 191*p* having a recess pattern DPb are formed. Further, the resist pattern 191*p* has a residual resist film 191*r* on the bottom portion of each pattern.

The recess pattern DPb is a recess pattern to which the dummy pattern DMb is transferred and is located between the plurality of contact patterns PP. As a result, the plurality of contact patterns PP each are sandwiched between the recess patterns DP and DPb.

Figure 14A:
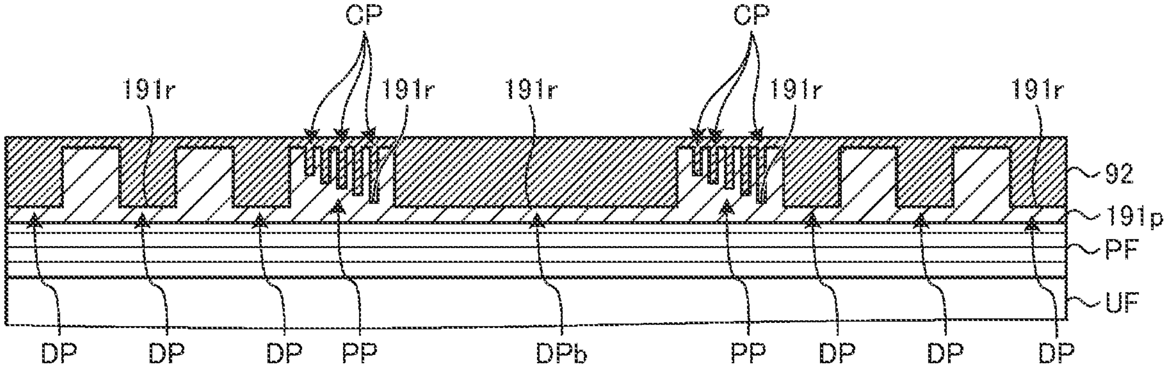
FIGS. 14A to 14C are cross-sectional views sequentially illustrating a part of the procedure of the semiconductor device manufacturing method according to a Modification 2 of Embodiment 1.

As illustrated in FIG. 14A, the resist film 92 that covers the resist pattern 191*p* is formed.

Figure 14B:
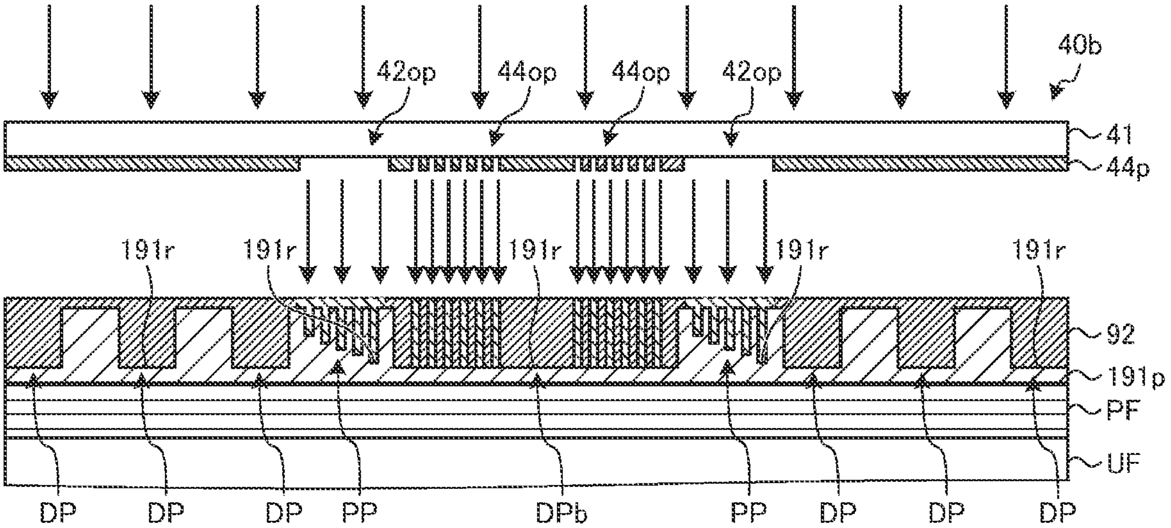

As illustrated in FIG. 14B, a photomask 40*b* faces the resist film 92. The photomask 40*b* includes the transparent substrate 41 and a light shielding film pattern 44*p*.

Like the light shielding film pattern 42*p* described above, the light shielding film pattern 44*p* includes the plurality of openings 42*op* larger than the plurality of contact patterns PP at positions of vertically overlapping with the plurality of contact patterns PP. Further, the light shielding film pattern 44*p* has a plurality of openings 44*op* at positions vertically overlapping with the recess pattern DPb. The plurality of openings 44*op* are located, for example, without protruding from the region overlapping with the recess pattern DPb.

With the photomask 40*b* facing the resist film 92, the resist film 92 is irradiated with exposure light such as ultraviolet light passing through the openings 42*op* and 44*op* of the photomask 40*b*. As a result, portions of the resist film 92 that cover the plurality of contact patterns PP and certain portions of the resist film 92 on the recess pattern DPb are exposed.

Figure 14C:
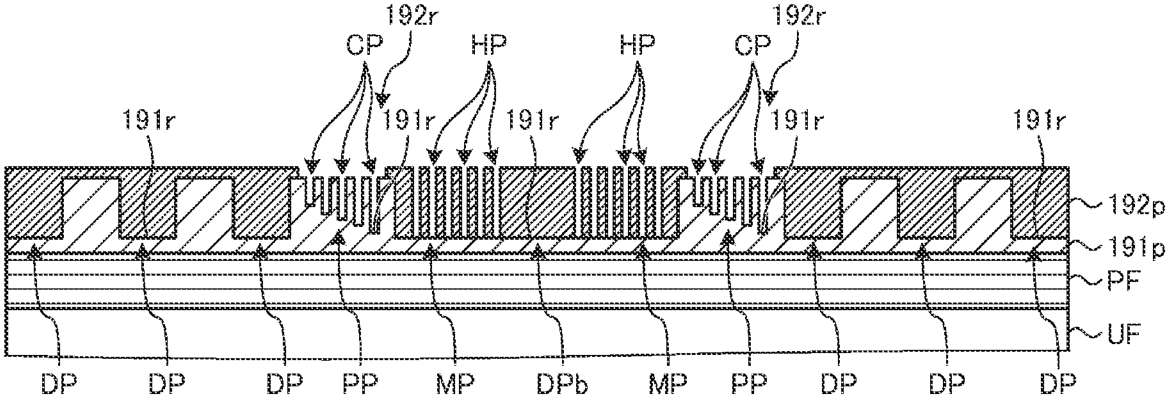

As illustrated in FIG. 14C, by developing the exposed resist film 92, a resist pattern 192*p* having openings 192*op* at positions overlapping with the contact patterns PP of the resist pattern 191*p* and memory patterns MP in the recess pattern DPb is formed. The memory patterns MP has a plurality of memory hole patterns HP.

Figure 15A:
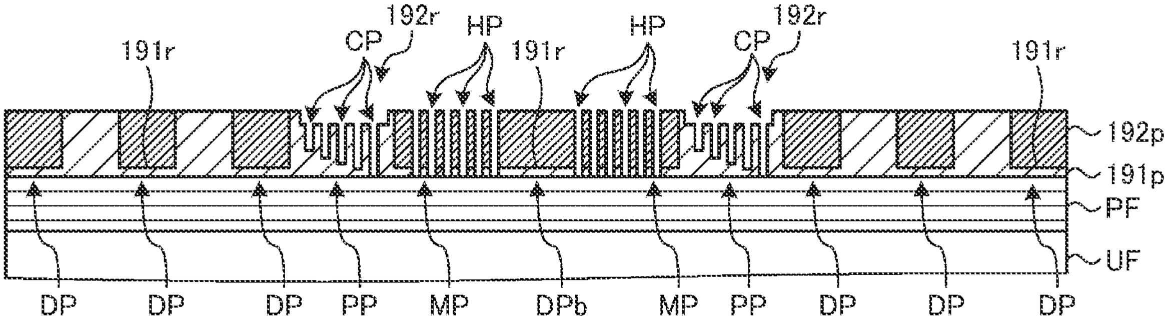
FIGS. 15A to 15C are cross-sectional views sequentially illustrating a part of the procedure of the semiconductor device manufacturing method according to a Modification 2 of Embodiment 1.

As illustrated in FIG. 15A, the residual resist film 191*r* in the bottom portions of the hole patterns CP as the deepest holes and the plurality of memory hole patterns HP is removed by using oxygen plasma and the like. As a result, the upper surface of the process film PF in the bottom portions of the hole patterns CP as the deepest hole and the plurality of memory hole patterns HP is exposed. Further, the film thicknesses of the resist patterns 191*p* and 192*p* are reduced as a whole.

Figure 15B:
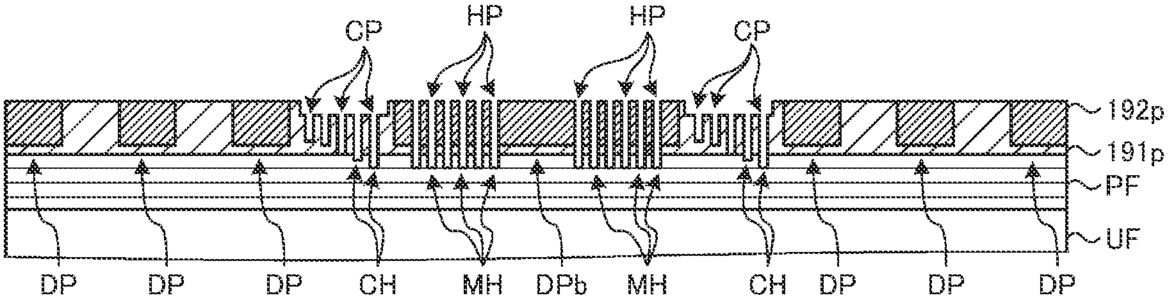

As illustrated in FIG. 15B, the process film PF is processed via the resist patterns 191*p* and 192*p*, the contact holes CH are sequentially formed on the process film PF, and also a plurality of memory holes MH are formed. By continuing the processing of the process film PF, reaching depths contact holes CH and the memory holes MH in the process film PF increase.

Figure 15C:
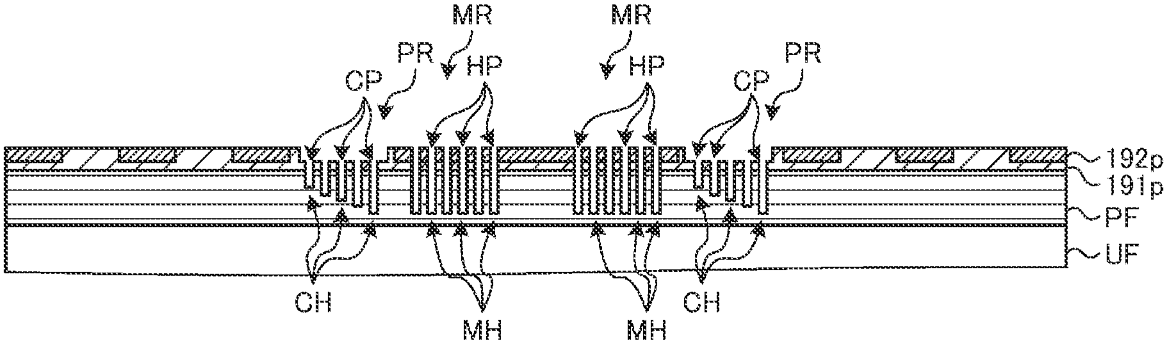

As illustrated in FIG. 15C, by continuing the processing as described above, contact holes CH having different reaching depths in the process film PF and memory holes MH having substantially the same reaching depths can be formed in the process film PF.

In this way, the regions in which the plurality of memory holes MH are formed are the memory regions MR in the semiconductor device MDV described above (see FIGS. 1A and 1B). Further, like the plurality of recess patterns DP, the recess pattern DPb is not transferred to the process film PF. Thereafter, the remaining resist patterns 191*p* and 192*p* are removed.

As described above, the pattern forming process using the template 11 of Modification 2 is completed.

Thereafter, the pillars PL obtained by stacking the multilayer structure including the channel layer CN in the plurality of memory holes MH to form the memory cell MC (see FIGS. 1A and 1B) is formed. Next, the stacked body LM in which word lines WL and insulating layers OL are alternately stacked is formed by performing the replacement process of the process film PF. Next, sidewalls of the contact holes CH are covered with insulating layers, the space left inside of the contact holes CH after the insulating layers are formed is filled with a metal layer to form the plurality of contacts CC.

With the above, the semiconductor device manufacturing method according to Modification 2 is completed.

By the pattern forming method according to Modification 2, after the resist film 92 is exposed and developed, the contact patterns PP of the resist pattern 191*p* are exposed, and also the memory patterns MP are formed in the resist film 92 located in the recess pattern DPb. When the process film PF is processed via the resist patterns 191*p* and 192*p*, the memory patterns MP are transferred to the process film PF, together with the contact patterns PP.

As a result, contact holes CH having different reaching depths in the process film PF and memory holes MH having substantially the same reaching depths can be collectively formed. By employing such a method, the workload and the costs at the time of manufacturing the semiconductor device MDV can be reduced.

In addition to the above, the pattern forming method according to Modification 2 exhibits the same effects as those of Embodiment 1.

In addition, in Modification 2 described above, the resist pattern 191*p* is covered with the positive resist film 92 but may be covered with the negative resist film 94 as in Modification 1 described above. In this case, the subsequent exposure of the resist film 94 is performed on a region obtained by inverting the exposure region of the resist film 92.

(Modification 3)

Next, a semiconductor device manufacturing method according to Modification 3 of Embodiment 1 is described with reference to FIGS. 16A to 18C. The semiconductor device manufacturing method according to Modification 3 is different from that of Embodiment 1 in that holes having different depths are formed between the plurality of contact regions PR of the process film PF.

FIGS. 16A to 18C are cross-sectional views sequentially illustrating a part of the procedure of the semiconductor device manufacturing method according to Modification 3 of Embodiment 1. The process illustrated in FIGS. 16A to 18C is a pattern forming method including an imprint process using a template 12 described below.

Figure 16A:
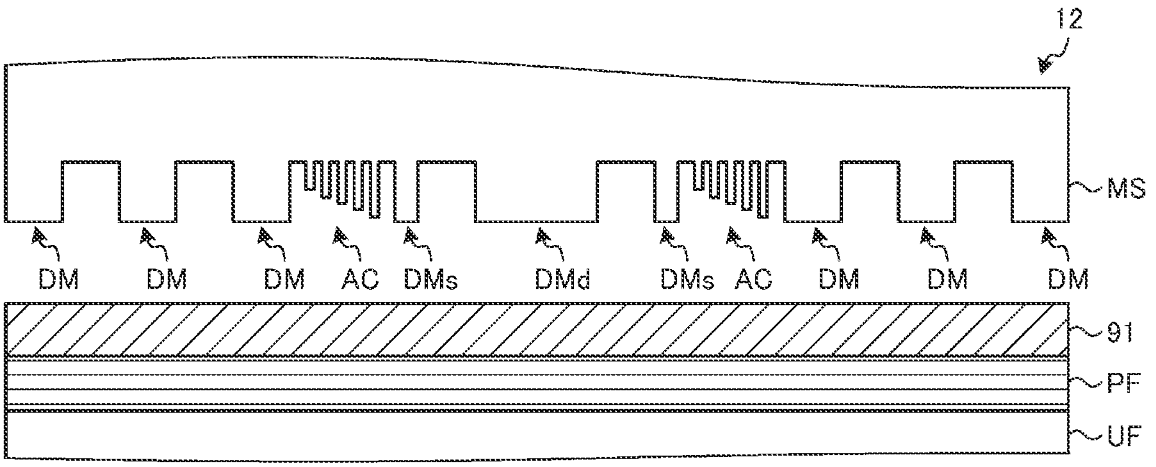
FIGS. 16A to 16C are cross-sectional views sequentially illustrating a part of a procedure of a semiconductor device manufacturing method according to a Modification 3 of Embodiment 1.

As illustrated in FIG. 16A, the template 12 according to this Modification 3 includes a plurality of actual patterns AC, a plurality of dummy patterns DM, and dummy patterns DMd and DMs located between the plurality of actual patterns AC.

The dummy patterns DMd and DMs include convex patterns each having a convex shape. Further, the dummy patterns DMs are located respectively adjacent to the actual patterns AC between the plurality of actual patterns AC and sandwich the actual patterns AC together with the dummy patterns DM. The dummy patterns DMd are located between the dummy patterns DMs respectively adjacent to the plurality of actual patterns AC.

Figure 16B:
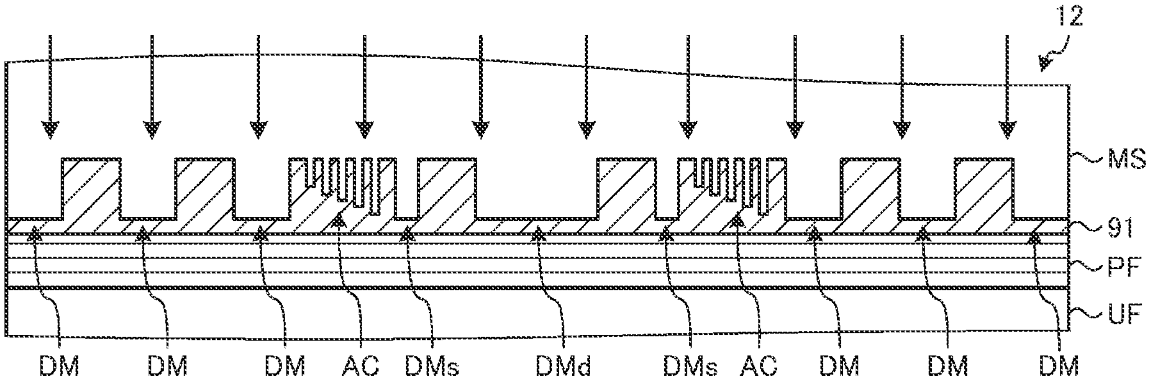

As illustrated in FIG. 16B, the actual patterns AC and the dummy patterns DM, DMd, and DMs of the template 12 are pressed against the resist film 91 on the process film PF. After this state is maintained for a predetermined period of time, and the resist film 91 spreads between the actual patterns AC and the dummy patterns DM, DMd, and DMs, the light such as ultraviolet light passing through the template 12 is irradiated to the resist film 91 and cured.

Figure 16C:
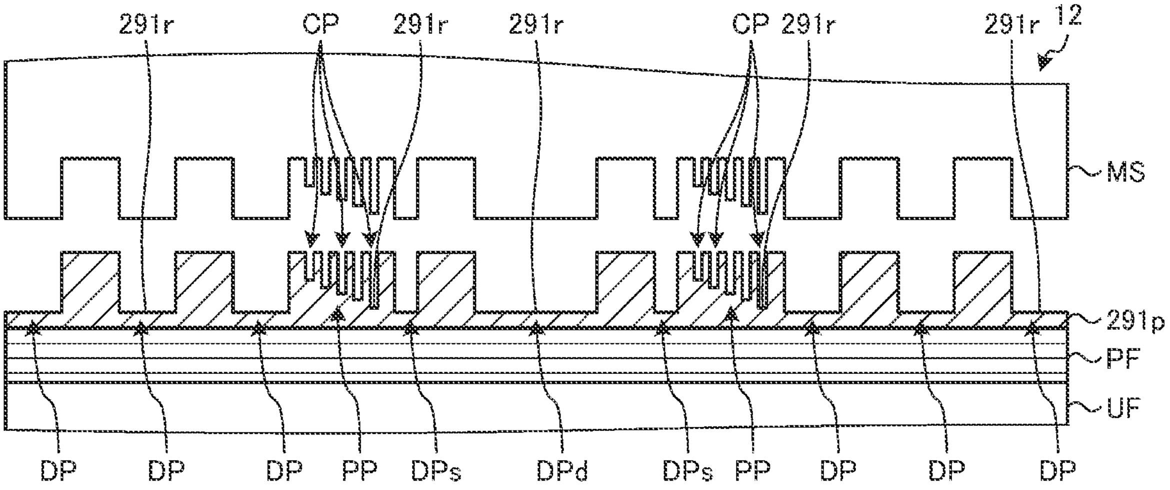

As illustrated in FIG. 16C, if the template 12 is released from the mold, a resist pattern 291*p* including the plurality of contact patterns PP, the plurality of recess patterns DP, DPd, and DPs is formed. Further, the resist pattern 291*p* has a residual resist film 291*r* on the bottom portion of each pattern.

The recess patterns DPs are recess patterns to which the dummy patterns DMs are transferred and are adjacent to the contact patterns PP between the plurality of contact patterns PP. As a result, the plurality of contact patterns PP each are sandwiched by the recess patterns DP and DPs.

The recess pattern DPd are recess patterns to which the dummy pattern DMd is transferred and is located between the recess patterns DPs respectively adjacent to the plurality of contact patterns PP.

Figure 17A:
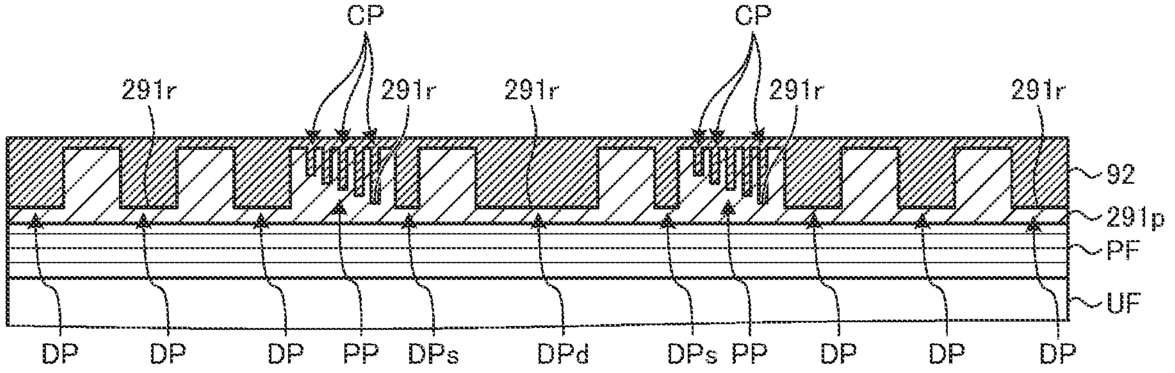
FIGS. 17A to 17C are cross-sectional views sequentially illustrating a part of the procedure of the semiconductor device manufacturing method according to a Modification 3 of Embodiment 1.

As illustrated in FIG. 17A, the resist film 92 that covers the resist pattern 291*p* is formed.

Figure 17B:
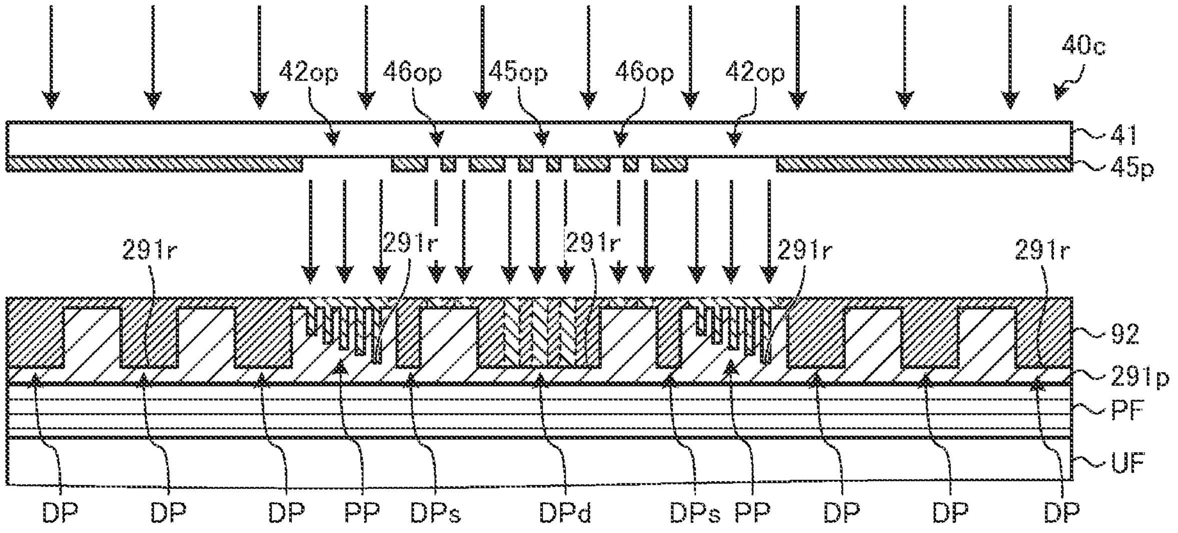

As illustrated in FIG. 17B, a photomask 40*c* faces the resist film 92. The photomask 40*c* includes the transparent substrate 41 and a light shielding film pattern 45*p*.

The light shielding film pattern 45*p* includes the plurality of openings 42*op* larger than the plurality of contact patterns PP at positions vertically overlapping with the plurality of contact patterns PP like the light shielding film pattern 42*p* described above.

Further, the light shielding film pattern 45*p* includes a plurality of openings 45*op* at positions vertically overlapping with the recess pattern DPd. The plurality of openings 45*op* are located in regions overlapping with the recess patterns DPd.

Further, the light shielding film pattern 45*p* includes a plurality of openings 46*op* at positions deviated from the recess patterns DPd and DPs, between the recess patterns DPd and DPs. That is, the plurality of openings 46*op* are located on the contact surface of the resist pattern 291*p* with the template 12 between the recess patterns DPd and DPs.

With photomask 40*c* facing the resist film 92, the resist film 92 is irradiated with the exposure light (such as ultraviolet light) passing through the openings 42*op*, 45*op*, and 46*op* of the photomask 40*c*. As a result, the portions of resist film 92 that cover the plurality of contact patterns PP and certain portions on the recess pattern DPd, and between the recess patterns DPd and DPs are exposed.

Figure 17C:
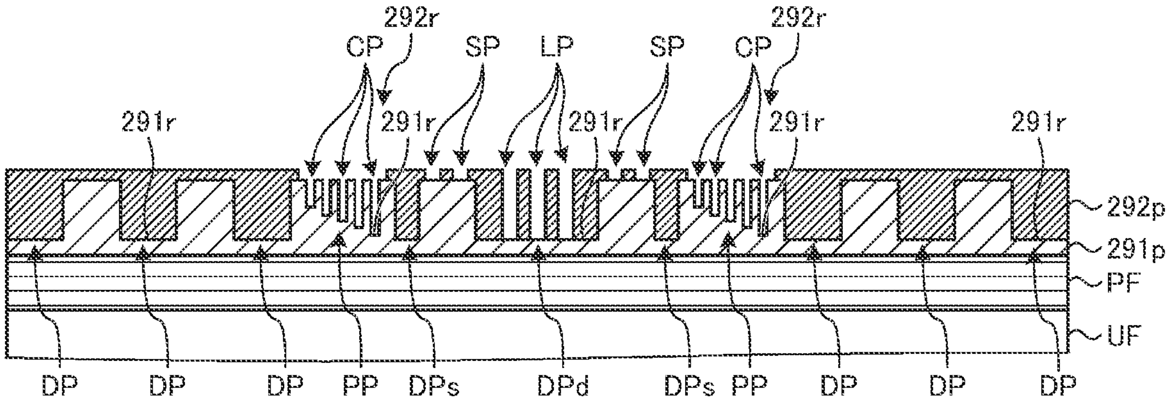

As illustrated in FIG. 17C, by developing the resist film 92 of which a portion is exposed, a resist pattern 292*p* including openings 292*op* at positions overlapping with the contact patterns PP of the resist pattern 291*p*, including a hole pattern LP at least in the recess pattern DPd, and further including a hole pattern SP at positions deviated from the recess patterns DPd and DPs is formed.

Figure 18A:
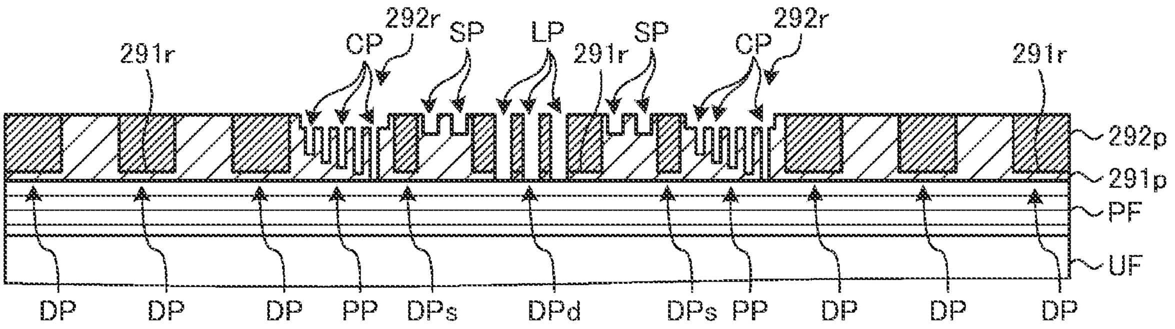
FIGS. 18A to 18C are cross-sectional views sequentially illustrating a part of the procedure of the semiconductor device manufacturing method according to a Modification 3 of Embodiment 1.

As illustrated in FIG. 18A, the residual resist film 291*r* in the bottom portions of the hole patterns CP as the deepest holes and the plurality of hole patterns LP are removed by using oxygen plasma or the like.

As a result, the upper surface of the process film PF in the bottom portions of the hole patterns CP as the deepest holes and the plurality of hole patterns LP are exposed. Further, the plurality of hole patterns SP are transferred to the contact surface of the resist pattern 291*p*. Further, the film thicknesses of the resist patterns 291*p* and 292*p* are reduced as a whole.

Figure 18B:
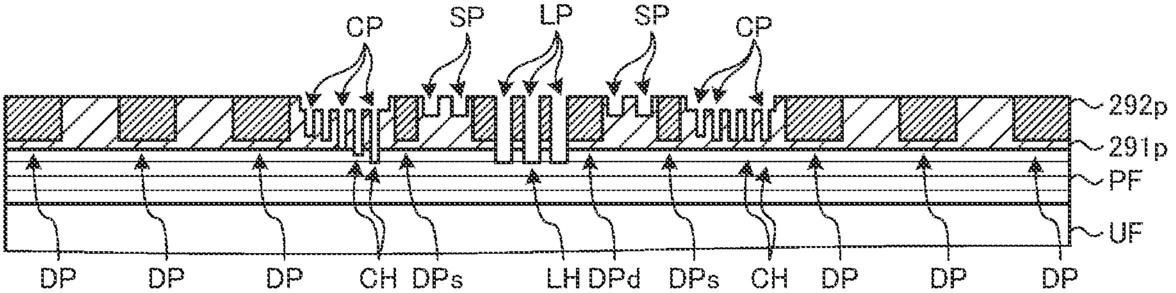

As illustrated in FIG. 18B, the process film PF is processed via the resist patterns 291*p* and 292*p*, the contact holes CH are sequentially formed in the process film PF, and also a plurality of holes LH are formed. By continuing the processing of the process film PF, reaching depths of the contact holes CH and the holes LH in the process film PF increase.

Figure 18C:
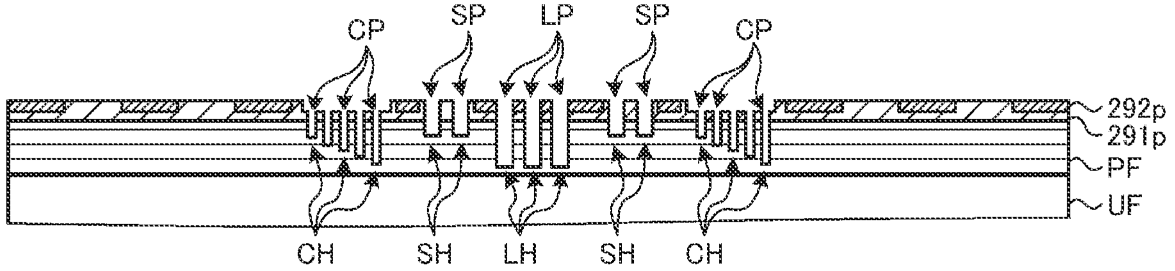

As illustrated in FIG. 18C, by continuing the processing as described above, reaching depths of the contact holes CH and the holes LH in the process film PF further increase. Also, the resist pattern 191*p* exposed in the bottom portions of the hole patterns SP is eventually removed, and the hole pattern SP is transferred to the process film PF so that a plurality of holes SH are formed.

As a result, contact holes CH having different reaching depths in the process film PF, holes LH having substantially the same reaching depths in the process film PF, and holes SH having reaching depths shallower than the holes LH but substantially the same reaching depths in the process film PF are formed in the process film PF.

With the above, the pattern forming process using the template 12 is completed.

Thereafter, the pillars PL (see FIGS. 1A and 1B) are formed between the plurality of contact regions PR, the process film PF is replaced to form the stacked body LM, and further metal layers or the like are embedded into the plurality of contact holes CH to form the contacts CC. Further, a desired configuration having different depths can be formed by appropriately embedding a predetermined material into the plurality of holes LH and SH.

With the above, the semiconductor device manufacturing method according to Modification 3 is completed.

In the pattern forming method according to Modification 3, when the resist film 92 is exposed and developed, the hole patterns LP are formed in the resist film 92 located in the plurality of recess patterns DPd, the hole patterns SP are formed in the resist film 92 located at positions deviated from the plurality of recess patterns DPd and DPs, a part of the contact surface of the resist pattern 291*p* between the plurality of recess patterns DPd and DPs is exposed, the hole pattern LP is transferred to the process film PF, and the hole patterns SP are transferred to the process film PF to be shallower than the hole patterns LP.

As a result, the holes LH and SH having different reaching depths in the process film PF can be collectively formed by exposing and developing the resist film 92 once. By employing such a method, a semiconductor device having various configurations in which reaching depths in the stacked body LM are respectively different can be efficiently manufactured, and the workload and the costs at the time of manufacturing can be further reduced.

In addition to the above, the pattern forming method according to Modification 3 exhibits the same effects as those of Embodiment 1.

In Modification 3, the resist pattern 291*p* is covered with the positive resist film 92 but in other examples may be covered with the negative resist film 94 as in Modification 1. In this case, the subsequent exposure of the resist film 94 would be performed on a region obtained by inverting the exposure region of the resist film 92.

Embodiment 2

Hereinafter, Embodiment 2 is described below with reference to the drawings. Embodiment 2 is different from Embodiment 1 in that the imprint process is performed by locating a resist material on the film to be processed (process film) by an inkjet method. In the following, the same reference symbols are given to those aspects that are the same as in Embodiment 1 already described above, and additional description thereof may be omitted.

(Configuration Example of Imprint Apparatus)

Figure 19:
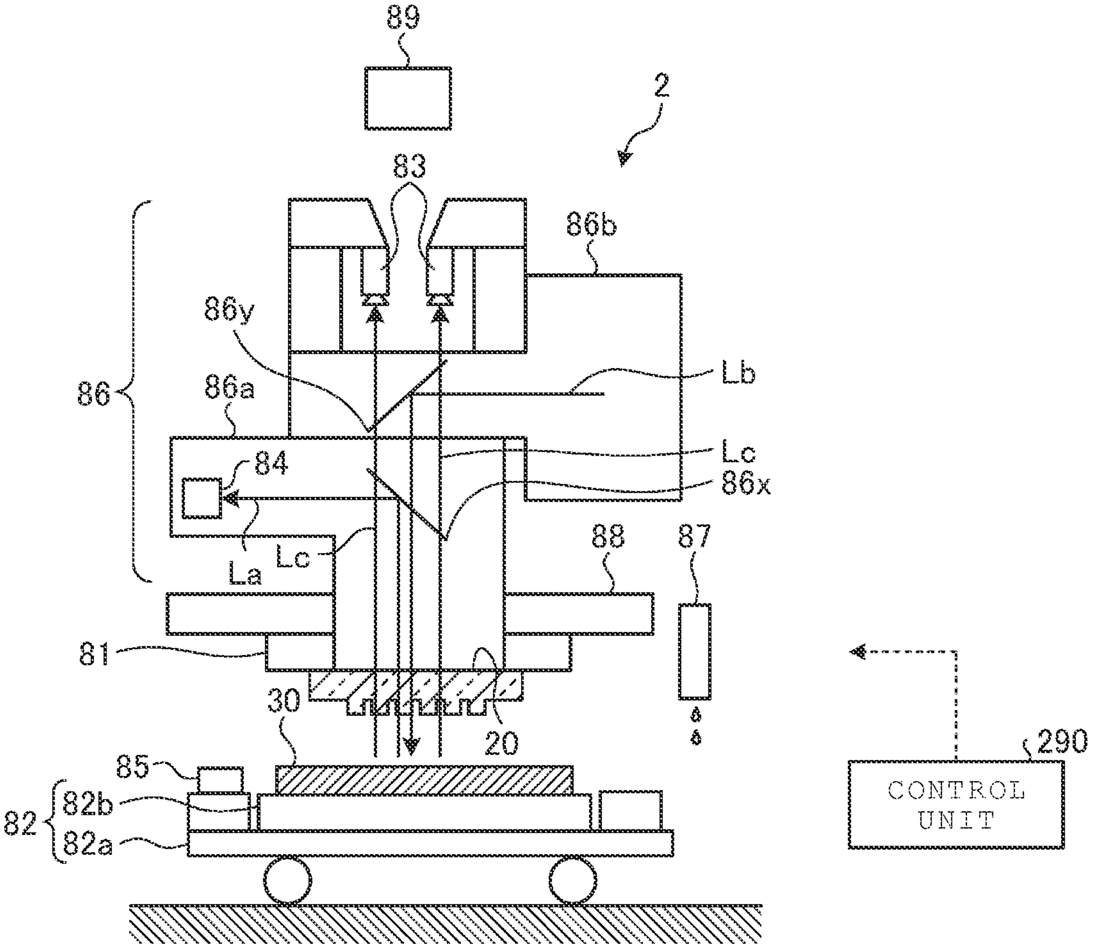
FIG. 19 is a diagram illustrating a configuration example of an imprint apparatus according to Embodiment 2.

FIG. 19 is a diagram illustrating a configuration example of an imprint apparatus 2 according to Embodiment 2. As illustrated in FIG. 19, the imprint apparatus 2 includes a droplet dispensing device 87 in addition to the configuration of the imprint apparatus 1 according to Embodiment 1. Further, the imprint apparatus 2 includes a control unit 290 instead of the control unit 90 in the imprint apparatus 1 according to Embodiment 1.

The droplet dispensing device 87 is a device that dispenses a resist material onto the wafer 30 by an inkjet method. The inkjet head in the droplet dispensing device 87 includes a plurality of fine holes (nozzles) for ejecting droplets of the resist material and locates droplets of the resist material on the wafer 30.

The control unit 290 controls each unit of the imprint apparatus 2 including the droplet dispensing device 87. Further, the control unit 290 controls the wafer stage 82, moves the wafer 30 below the droplet dispensing device 87 when the resist material is dispensed onto the wafer 30, and moves the wafer 30 below the template 10 when the transfer process is performed on the wafer 30.

(Semiconductor Device Manufacturing Method)

Next, an example of the imprint process in the imprint apparatus 2 described above is described with reference to FIGS. 20A to 20C.

Figure 20A:
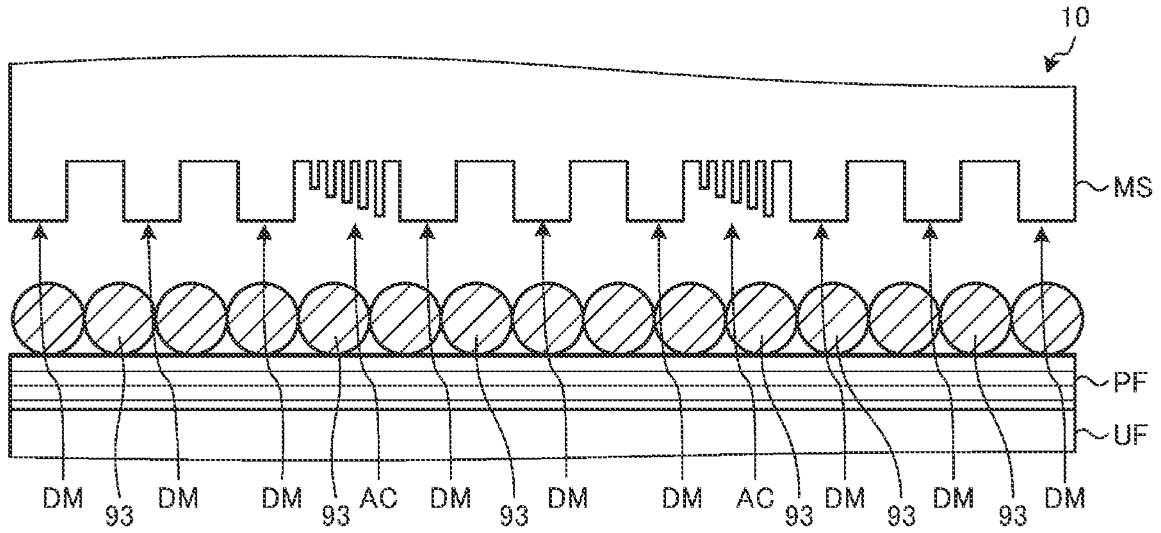
FIGS. 20A to 20C are cross-sectional views illustrating a part of a procedure of an imprint process in the imprint apparatus according to Embodiment 2.
Figure 20B:
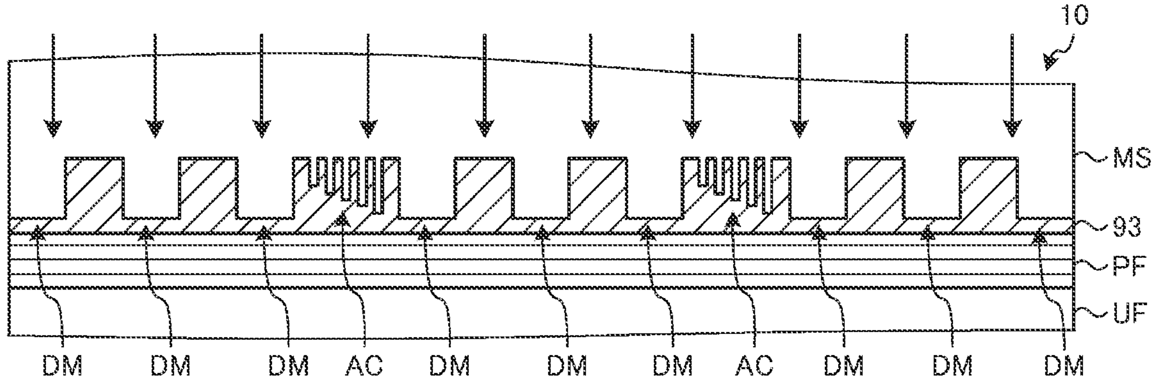
Figure 20C:
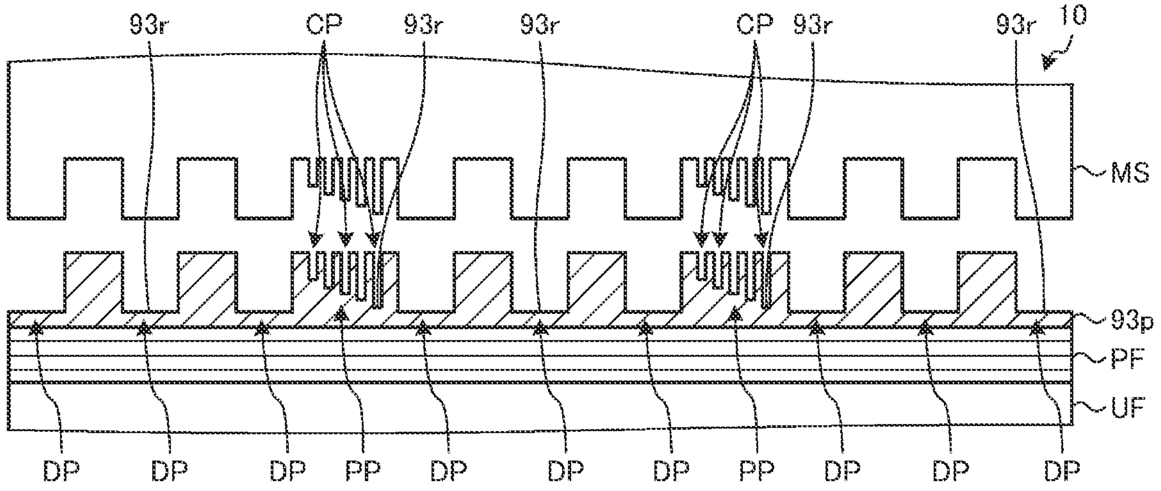

FIGS. 20A to 20C are cross-sectional views illustrating a part of the procedure of the imprint process in the imprint apparatus 2 according to Embodiment 2. The process illustrated in FIGS. 20A to 20C corresponds to the process of FIG. 4 described above, may be performed as a part of the method of manufacturing the semiconductor device MDV according to Embodiment 1, and further may be performed as a part of the pattern forming method including the imprint process using the template 10.

As illustrated in FIG. 20A, a resist material 93 is dispensed onto the process film PF as droplets by the droplet dispensing device 87 of the imprint apparatus 2. Accordingly, a plurality of droplets are located on the process film PF. The droplets of the resist material 93 are located, for example, to cover the entire region on the process film PF to which the actual patterns AC and the dummy patterns DM in the mesa portion MS of the template 10 are to be transferred. The resist material 93 is, for example, an uncured photocurable resin (resin precursor), like the resist film 91 described above.

The template 10 is caused to face the process film PF on which the droplets of the resist material 93 are located, so that the surface on which the columnar-shaped patterns CL are formed faces the process film PF.

As illustrated in FIG. 20B, the columnar-shaped patterns CL of the template 10 are pressed against the droplets of the resist material 93. At this time, a slight gap is provided between the columnar-shaped pattern CL having the largest protrusion amount and the process film PF so that the mesa portion MS of the template 10 does not come into contact with the process film PF.

By maintaining this state for a predetermined period of time, the droplets of the resist material 93 are wet and spread on the surface of the process film PF in a film-like manner, and also penetrate between the columnar-shaped patterns CL of the template 10 and between the dummy patterns DM.

After spaces between the columnar-shaped patterns CL and the dummy patterns DM of the template 10 are filled with the resist material 93, the resist material 93 is irradiated with light such as ultraviolet light and cured while the template 10 is kept pressed.

As illustrated in FIG. 20C, once the template 10 is released from the mold, a resist pattern 93*p* having the contact surface of the template 10 with the reference surface RP as the upper surface is formed. The plurality of contact patterns PP and the plurality of recess patterns DP are formed on the contact surface of the resist pattern 93*p*. The resist pattern 93*p* also has a residual resist film 93*r* on the bottom portion of the hole pattern CP having the deepest hole among the hole patterns CP.

Thereafter, the process illustrated in FIGS. 5A to 6F as described above is performed, and a plurality of holes CH having different reaching depths are formed in the process film PF, as in Embodiment 1. Further, by forming the contacts CC from these holes CH, for example, the semiconductor device MDV described above can be manufactured.

In addition, in the process illustrated in FIGS. 5A to 6F described above, instead of the positive resist film 92, the negative resist film 94 may be used as in Modification 1 of Embodiment 1 described above.

(Overview)

In the pattern forming method according to Embodiment 2, the resist pattern 93*p* to which the columnar-shaped patterns CL and the dummy patterns DM of the template 10 are transferred is formed by dispensing droplets of the resin material onto the film to be processed (process film).

In an imprint process using an inkjet method, air bubbles may be easily trapped in a region where the pattern is sparse. However, even when the inkjet method is used, formation defects of the resist pattern 93*p* can be prevented by preventing the trapping of the air bubbles.

In addition, the pattern forming method according to Embodiment 2 exhibits the same effects as those of Embodiment 1.

(Modification 1)

Next, Modification 1 of Embodiment 2 is described with reference to FIGS. 21A to 21C. Modification 1 is different from Embodiment 2 in that droplets of the resist material are located on the film to be processed according to an amount required to form the subsequent resist pattern.

Figure 21A:
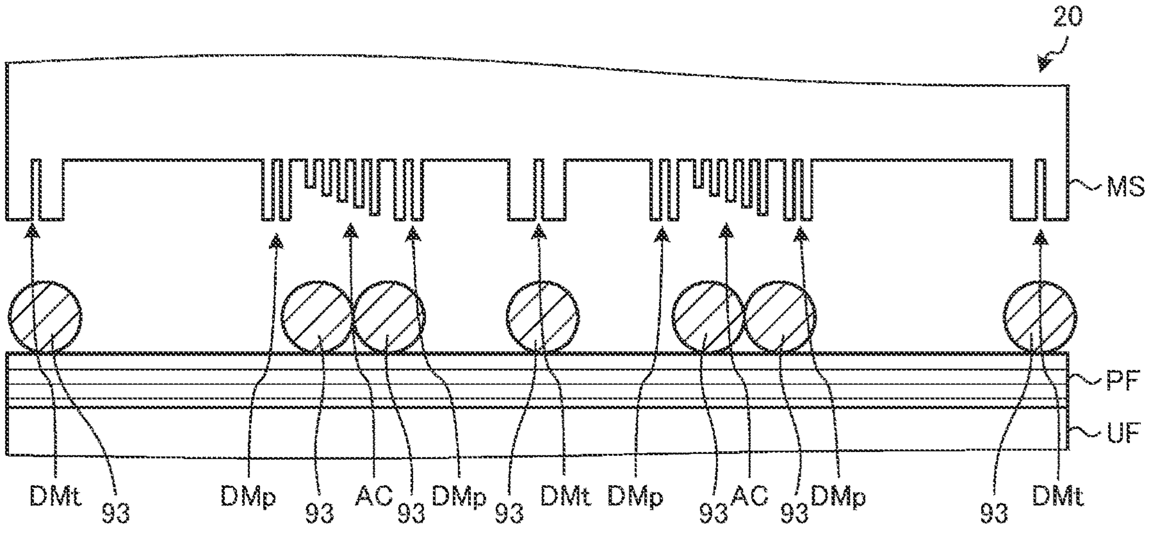
FIGS. 21A to 21C are cross-sectional views illustrating a part of the procedure of the imprint process using a template according to a Modification 1 of Embodiment 2.
Figure 21B:
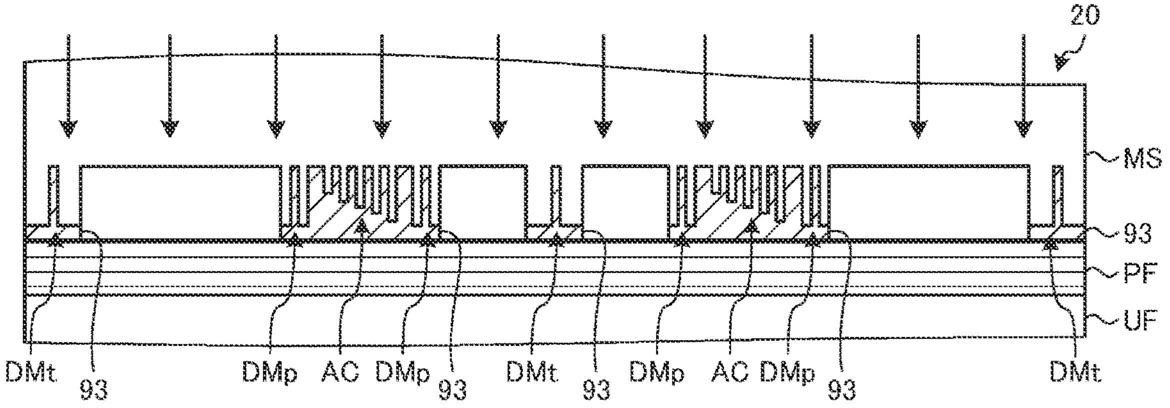
Figure 21C:
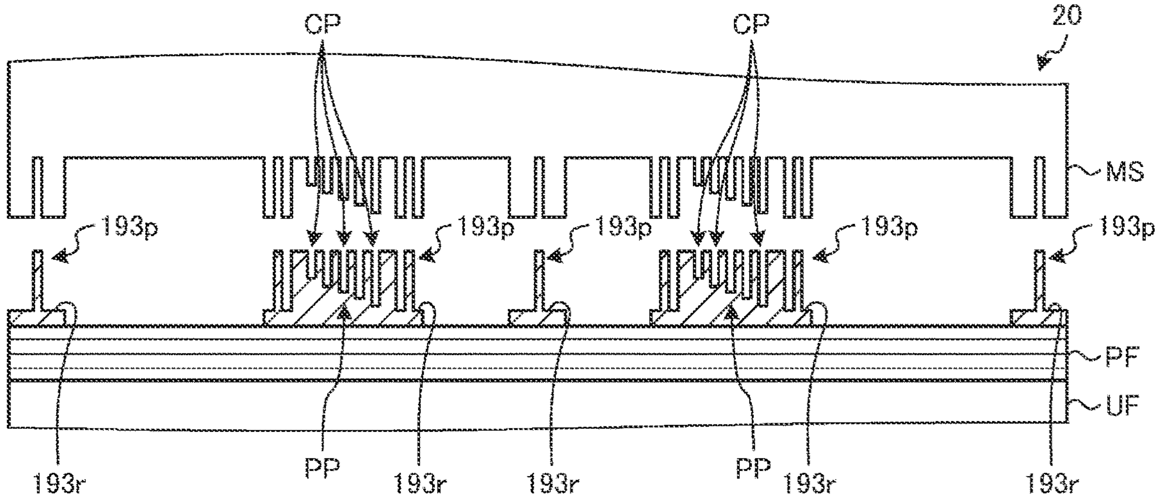

FIGS. 21A to 21C are cross-sectional views illustrating a part of the procedure of the imprint process using a template 20 according to Modification 1 of Embodiment 2.

As illustrated in FIG. 21A, the template 20 according to Modification 1 has, for example, fewer patterns. More specifically, the template 20 includes the plurality of dummy patterns DMp and DMt together with the plurality of actual patterns AC like the template 10 according to Embodiment 1 described above.

The dummy patterns DMp are located on the mesa portion MS of the template 20 to sandwich each of the actual patterns AC. With these dummy patterns DMp, actual patterns AC are protected so that damage or the like to the actual patterns AC is prevented.

The dummy patterns DMt are located between the end portions of the mesa portion MS and the plurality of actual patterns AC. When the template 20 is pressed against the resist material 93 on the process film PF, the dummy patterns DMt prevent the bending of the template 20 and possible contact of the end portions or the central portion of the mesa portion MS with the process film PF.

It is generally desirable that a minimum number of dummy patterns DMp and DMt are located in the template 20 of Modification 1.

The plurality of droplets of the resist material 93 are located on the process film PF. However, the droplets of the resist material 93 are not located over the entire process film PF but are located only at positions that vertically overlap (correspond to) the actual pattern AC and the dummy patterns DMp and DMt of the template 20, respectively. Further, the number of droplets of the resist material 93 located at each position on the process film PF can be adjusted according to the sizes, and the uneven portion shapes and the like in the actual patterns AC and the dummy patterns DMp and DMt.

That is, when the sizes of predetermined patterns such as the actual patterns AC are the same, the amount of the resist material 93 required to transfer the patterns tends to increase as the number of uneven portions formed in the patterns increases. In other words, as the volume of the resist pattern after the transfer of the predetermined pattern increases, the amount of resist material 93 required to transfer the pattern tends to increase.

Here, it is assumed as an example that the amount of the resist material 93 required to transfer one actual pattern AC and its adjacent dummy patterns DMp is an amount corresponding to two droplets, which is the minimum dispensing amount of the resist material 93. In this case, two droplets are located at positions on the process film PF corresponding to the actual pattern AC and its adjacent dummy patterns DMp.

In addition, it is assumed in this example that the amount of the resist material 93 required to transfer one dummy pattern DMt is an amount corresponding to one droplet of the resist material 93. In this case, one droplet is located at a position on the process film PF corresponding to each dummy pattern DMt.

The amount of the resist material 93 located at a predetermined position on the process film PF can be adjusted only by adjusting the number of droplets in this example, and thus the minimum adjustable amount (increment) is a discrete value (corresponding to droplet size). For this reason, it is desirable that the sizes, and the uneven portion shapes and the like in the dummy patterns DMp and DMt be adjusted (designed) so that the discrete amount substantially matches the amount of the resist material 93 required to transfer the pattern to each dummy pattern DMp and DMt.

As illustrated in FIG. 21B, the actual pattern AC and the dummy patterns DMp and DMt of the template 20 are pressed against the droplets of the resist material 93 with a slight gap left between the process film PF and the columnar-shaped pattern CL having the largest protrusion amount of the actual pattern AC.

By maintaining this state for a predetermined period of time, the droplets of the resist material 93 wet and spread in a film-like manner on the process film PF at positions overlapping with the actual pattern AC and the dummy patterns DMp and DMt. Further, droplets of the resist material 93 corresponding to the actual pattern AC and the dummy pattern DMp penetrate into the actual pattern AC and the dummy pattern DMp. Further, the droplets of the resist material 93 corresponding to the dummy pattern DMt penetrate into the dummy pattern DMt.

After the insides of the actual pattern AC and the dummy patterns DMp and DMt of the template 20 are filled with the resist material 93, while the template 20 is pressed, the resist material 93 is irradiated with light such as ultraviolet light and cured.

As illustrated in FIG. 21C, when the template 20 is released from the mold, resist patterns 193*p* to which the actual patterns AC and the dummy patterns DMp and DMt are respectively transferred are formed.

In the resist patterns 193*p*, portions to which the actual patterns AC and the dummy patterns DMp are transferred and a portion to which a dummy pattern DM5 is transferred are spaced from each other and located on the process film PF. Further, these portions of the resist patterns 193*p* all have residual resist films 193*r* on the bottom surface.

Thereafter, the process of FIGS. 5A to 6F described above is performed, and the holes CH having different reaching depths are formed in the process film PF as in Embodiment 1. Further, the contacts CC are formed from these holes CH, for example, so that the semiconductor device MDV described above can be manufactured.

In addition, in the process of FIGS. 5A to 6F the negative resist film 94 instead of the positive resist film 92 may be used as in Modification 1 of Embodiment 1.

In the pattern forming method according to Modification 1 of Embodiment 2, the imprint process can be performed using the template 20 in which the number of dummy patterns DMp and DMt is reduced as much as possible.

By configuring the template 20 in this way, the number of processes required when the template 20 is manufactured is reduced, so that the template 20 can be manufactured in a shorter period of time at lower cost. Further, by reducing the number of different patterns in the template 20, the risk that these patterns may be damaged is reduced so as to extend the lifespan of the template 20.

According to the pattern forming method of Modification 1, droplets of the resist material 93 are located at positions overlapping with the actual patterns AC and the dummy patterns DMp and DMt in the vertical direction.

In this case, as compared with a case where droplets are located over the whole of the actual patterns AC and the dummy patterns DMp and DMt, the usage amount of the resist material 93 can be reduced to reduce the cost of the imprint process.

Furthermore, droplets of the resist material 93 are located only in regions corresponding to the actual patterns AC and the dummy patterns DMp and DMt to form the resist patterns 193*p*, and thus the trapping of air bubbles can be further prevented.

Here, in the imprint process, there is a problem that formation defect of the resist pattern easily occurs, because the resist material protrudes from a pattern forming region of the template when the template is pressed against the resist material.

As described above, in the template 20, in which the number of dummy patterns DMp and DMt is reduced as much as possible, there is concern that the resist material protrudes more easily.

In the pattern forming method according to Modification 1, when droplets of the resist material 93 are dispensed onto the process film PF, droplets corresponding to the volume of the resist patterns 193*p* after the transfer of the actual patterns AC and the dummy patterns DMp and DMt are dispensed. As a result, protrusion of the resist material 93 can be prevented, and formation defects of the resist patterns 193*p* can be prevented.

In addition to the above, the pattern forming method according to this Modification 1 exhibits the same effects as those of Embodiment 2 described above.

(Modification 2)

Next, Modification 2 of Embodiment 2 is described with reference to FIGS. 22A to 22C. This Modification 2 is different from Modification 1 in that the shapes and the arrangement of resist forming regions RR on the process film PF are adjusted.

Figures 22A, 22B, 22C:
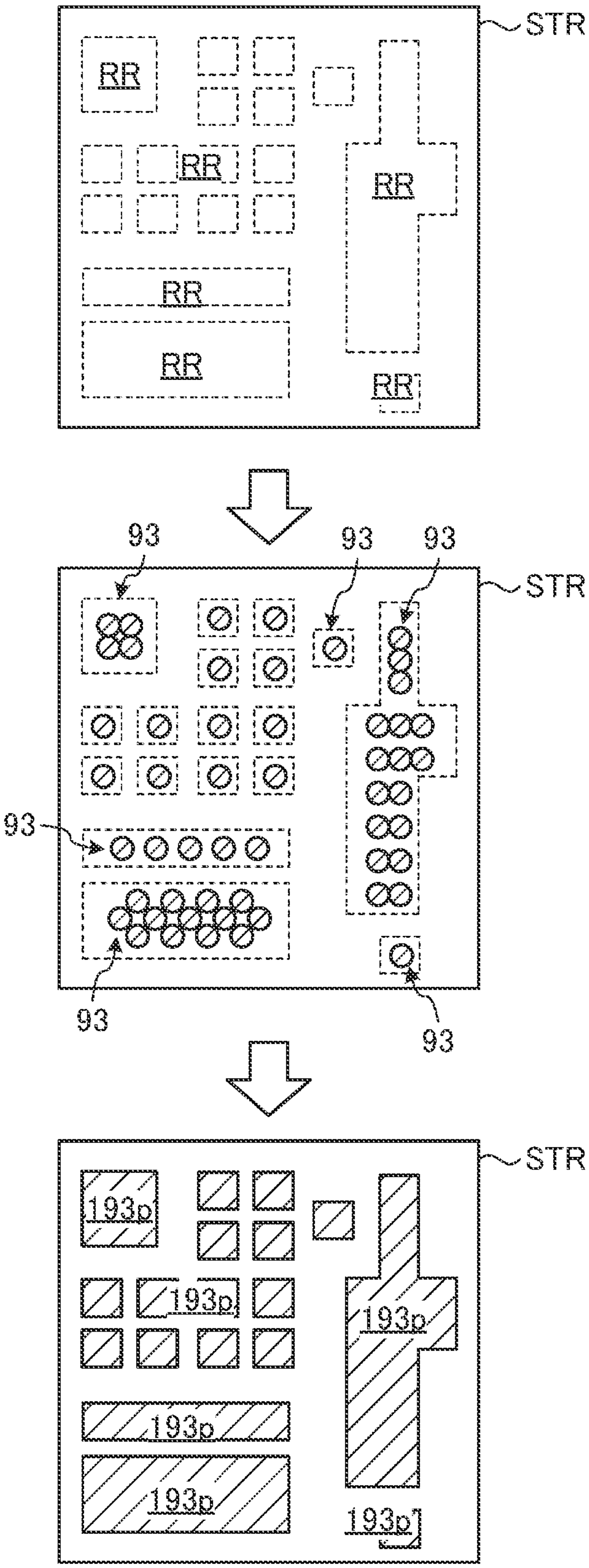
FIGS. 22A to 22C are top views illustrating a part of a procedure of an imprint process according to a Modification 2 of Embodiment 2.

FIGS. 22A to 22C are top views illustrating a part of the procedure of the imprint process according to Modification 2 of Embodiment 2. In FIGS. 22A to 22C, the imprint process using template 20 (described above) is performed.

A shot region STR illustrated in FIGS. 22A to 22C is a region on the upper surface of the process film PF and is a region to which a pattern is transferred when the template 20 is pressed once.

As illustrated in FIG. 22A, the plurality of resist forming regions RR are set in the shot region STR of the process film PF. The resist forming regions RR are regions where the resist patterns 193*p* are to be formed, for example, in the imprint process of FIGS. 21A to 21C described above.

The sizes, shapes, and arrangement of the resist forming regions RR are adjusted to prevent the connection of the resist patterns 193*p* to each other between the resist forming regions RR and protrusion of the resist patterns 193*p* from the resist forming regions RR.

In order to form the resist patterns 193*p* in the resist forming regions RR, the sizes, the shapes, and the arrangement of the dummy patterns DMp and DMt in the template 20 and the shape and arrangement on the reference plane are also adjusted according to the sizes, the shapes, and the arrangement of the resist forming regions RR.

As illustrated in FIG. 22B, in order to form the resist patterns 193*p* in the resist forming regions RR, the droplets of the resist material 93 are dispensed. At this time, the droplets of the resist material 93 are positioned to fall in the resist forming regions RR, respectively.

That is, the droplet of the resist material 93 in each resist forming region RR is spaced from a droplet of another resist forming region RR. However, a plurality of droplets located in the same resist forming region RR may be or may not be in contact with each other.

Furthermore, the number of droplets of the resist material 93 in each resist forming region RR can be adjusted according to the sizes, and the uneven portion shapes and the like in the pattern of the template 20 transferred to the resist forming region RR. As a result, the protrusion of the resist pattern 193*p* and contact between the resist forming regions RR are prevented.

In this way, the process illustrated in FIG. 22B corresponds to the process of locating the droplets of the resist material 93 illustrated in FIG. 21A described above onto the process film PF.

As illustrated in FIG. 22C, when the actual patterns AC and the dummy patterns DMp and DMt of the template 20 are transferred to the droplets of the resist material 93 dispensed onto the process film PF, the resist patterns 193*p* are formed in the resist forming regions RR, respectively.

In this way, the process illustrated in FIG. 22C corresponds to the process illustrated in FIGS. 21B and 21C described above in which the template 20 is pressed against the resist material 93, and the resist patterns 193*p* are formed on the process film PF.

As described above, since the sizes, the shapes, and the arrangement of the resist forming regions RR are adjusted, the contact of the resist pattern 193*p* in each resist forming region RR with the resist pattern 193*p* in another resist forming region RR is prevented. Further, in the example illustrated in FIG. 22C, the resist patterns 193*p* are formed without protruding from the resist forming regions RR.

In the pattern forming method according to Modification 2, the sizes, the shapes, and the arrangement of the resist forming regions RR on the process film PF are optimized. As a result, the formation defect of the resist patterns 193*p* can be prevented by preventing the protrusion of the resist material 93. Accordingly, the connection of the resist patterns 193*p* to each other, which are respectively formed in the resist forming regions RR is prevented.

In addition to the above, the pattern forming method according to Modification 2 exhibits the same effects as those of Embodiment 2 described above.

(Modification 3)

Next, Modification 3 of Embodiment 2 is described with reference to FIGS. 23A to 23C. The configuration of Modification 3 is different from Modification 1 described above in that the resist materials 93 and 95 of different types are located on the process film PF.

Figure 23A:
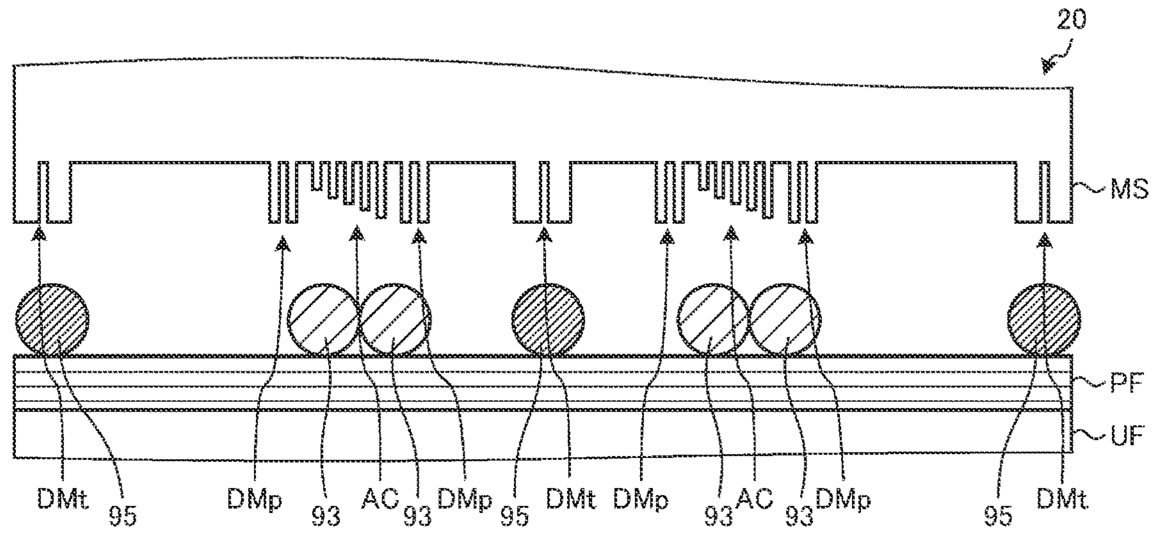
FIGS. 23A to 23C are cross-sectional views illustrating a part of a procedure of an imprint process according to a Modification 3 of Embodiment 2.
Figure 23B:
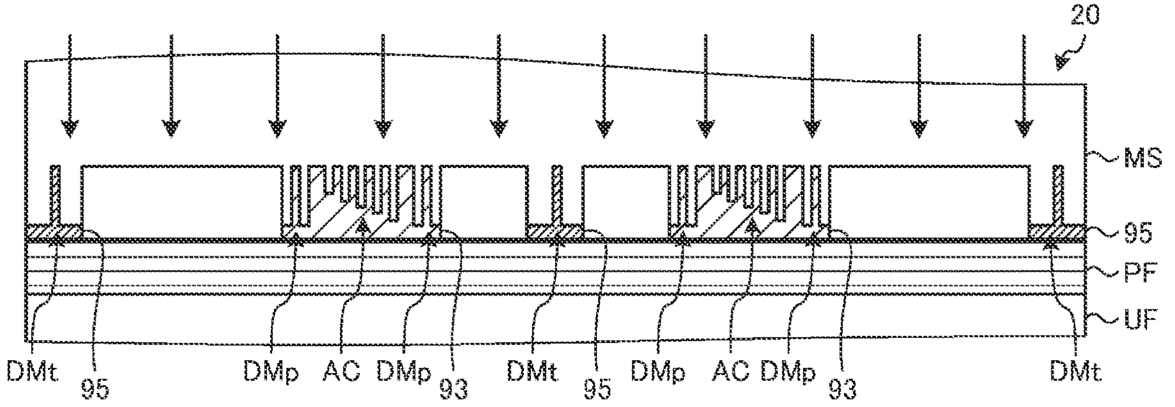
Figure 23C:
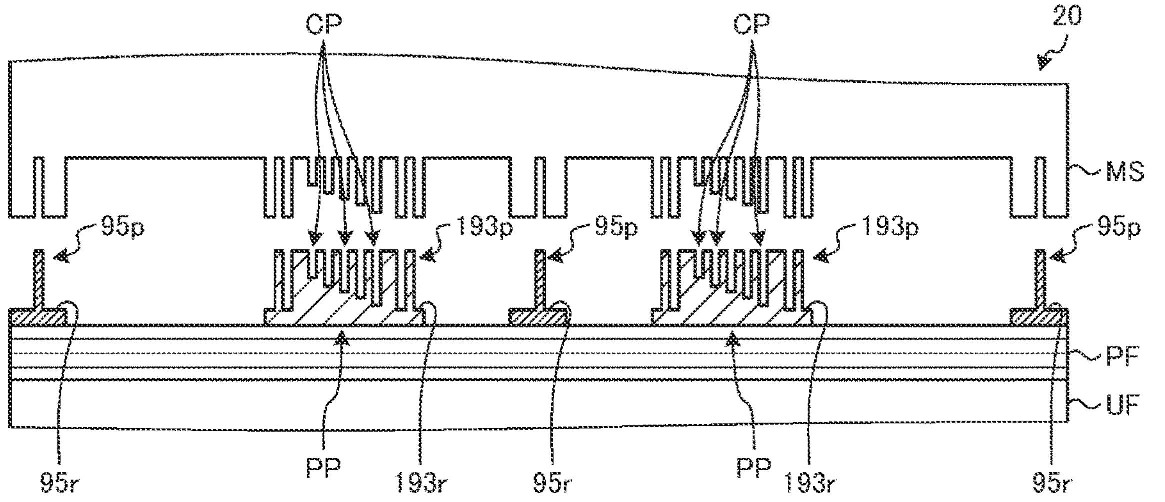

FIGS. 23A to 23C are cross-sectional views illustrating a part of the procedure of the imprint process according to Modification 3 of Embodiment 2. In FIGS. 23A to 23C, it is assumed that the imprint process using the template 20 according to Modification 1 described above is performed.

As illustrated in FIG. 23A, droplets of different resist materials 93 and 95 are respectively located on the process film PF at positions vertically overlapping with the actual patterns AC and the dummy patterns DMp and DMt of the template 20. Like the resist material 93, the resist material 95 is, for example, an uncured photocurable resin.

These resist materials 93 and 95 are different types of resist materials, but each can be freely selected in terms of material, composition, or the like. As for the materials of the resist materials 93 and 95, the selection can be made so that one is a silicon-based material and the other is a non-silicon-based material. As for the composition of the resist materials 93 and 95, the composition ratio with a solvent, an additive, and the like can be varied. By varying the compositions of the resist materials 93 and 95, the viscosities of these resist materials 93 and 95 can be made different, for example.

The types of resist materials 93 and 95 can be selected, for example, according to the sizes, and the uneven portion shapes and the like in the actual patterns AC and the dummy patterns DMp and DMt in the template 20. For example, a resist material of a type that wets and spreads well can be selected for a pattern having a large size, and a resist material of a type that more easily penetrates into the pattern can be selected for a pattern having a fine (narrower) shape.

It is assumed in this example that the resist material 93 is a particularly suitable type of resist material for imprinting the actual patterns AC and the dummy patterns DMp. Thus, droplets of the resist material 93 can be located at positions corresponding to the actual patterns AC and the dummy patterns DMp.

It is assumed in this example that the resist material 95 is particularly suitable type of resist material for imprinting the dummy pattern DMt. Thus, droplets of the resist material 95 can be located at positions corresponding to the dummy patterns DMt.

In such a case, different types of resist materials (e.g., resist material 93 and resist material 95) can be located on the process film PF by an imprint apparatus including a plurality of droplet dispensing devices 87 (see FIG. 19). That is, the resist materials 93 and 95 can be dispensed onto the process film PF from different droplet dispensing devices 87 corresponding to the resist materials 93 and 95, respectively.

Furthermore, the number of droplets of the resist materials 93 and 95 may be adjusted according to the sizes, the shapes of the uneven portions, and the like of the corresponding pattern of the template 20.

As illustrated in FIG. 23B, the actual pattern AC and the dummy patterns DMp and DMt of the template 20 are pressed against the droplets of the resist materials 93 and 95 with a slight gap between the columnar-shaped pattern CL having the largest protrusion amount of the actual pattern AC and the process film PF.

By maintaining this state for a predetermined period of time, the droplets of the resist materials 93 and 95 wet and spread in a film-like manner on the process film PF and penetrate into the actual patterns AC and the dummy patterns DMp and DMt.

When the insides of the actual patterns AC and the dummy patterns DMp and DMt of the template 20 are filled with the resist materials 93 and 95, the resist materials 93 and 95 are irradiated with light such as ultraviolet light and cured while being pressed against the template 20.

As illustrated in FIG. 23C, when the template 20 is released from the mold, the resist patterns including the resist patterns 193*p* and 95*p* are formed. The resist patterns 193*p* are resist patterns to which the actual patterns AC and the dummy patterns DMp are transferred. The resist pattern 95*p* is a resist pattern to which the dummy pattern DMt is transferred.

The resist patterns 193*p* and the resist pattern 95*p* are spaced from each other and located on the process film PF. Further, the resist patterns 193*p* include the residual resist films 193*r* on the bottom surface, and the resist pattern 95*p* includes the residual resist films 95*r* on the bottom surface.

Thereafter, the process of FIGS. 5A to 6F described above is performed, and holes CH having different reaching depths are formed in the process film PF as in Embodiment 1. Further, the contacts CC are formed from these holes CH, for example, so that the semiconductor device MDV described above can be manufactured.

In the process of FIGS. 5A to 6F described above, instead of the positive resist film 92, the negative resist film 94 may be used as in Modification 1 of Embodiment 1 described above.

In the pattern forming method according to Modification 3, droplets of the resist material 93 are dispensed at the positions corresponding to the actual patterns AC and the dummy patterns DMp, and droplets of the resist material 95 (of a different type from the resist material 93) are dispensed at the positions corresponding to the dummy patterns DMt.

As a result, appropriate types of the resist materials 93 and 95 can be used for each of the actual patterns AC and the dummy patterns DMp and DMt of the template 20. Therefore, the formation defects of the resist patterns 193*p* and 95*p* can be further prevented.

In addition to the above, the pattern forming method according to this Modification 3 exhibits the same effects as those of Embodiment 2 described above.

(Modification 4)

Next, Modification 4 of Embodiment 2 is described with reference to FIGS. 24A to 25C. The configuration of this Modification 4 is different from Modifications 2 and 3 in that the transfer process is performed a plurality of times (repeatedly) on the resist materials 93 and 95 on the process film PF.

FIGS. 24A to 25C are cross-sectional view sequentially illustrating a part of the procedure of the imprint process using a template 21 according to Modification 4 of Embodiment 2. In FIGS. 24A to 25C, different types of resist materials 93 and 95 can be used.

Figure 24A:
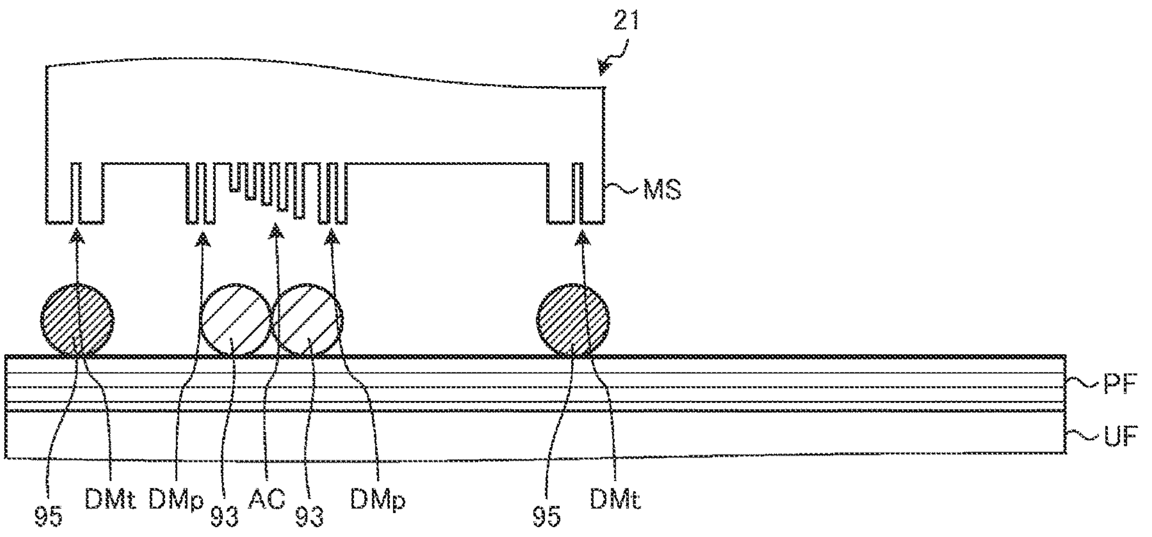
FIGS. 24A to 24C are cross-sectional views sequentially illustrating a part of a procedure of an imprint process using a template according to a Modification 4 of Embodiment 2.

As illustrated in FIG. 24A, the template 21 according to this Modification 4 includes, for example, one actual pattern AC located substantially in the center of the mesa portion MS of the template 21, dummy patterns DMp that sandwich the actual pattern AC, and dummy patterns DMt located in the end portions (outer edge portions) of the mesa portion MS.

As in the case of the template 20 of Modification 1, the dummy patterns DMp protect the actual patterns AC. Further, when the template 21 is pressed against the resist materials 93 and 95 on the process film PF, the dummy patterns DMt prevent the bending (warping) of the template 21 and the contact of the end portions of the mesa portion MS with the process film PF.

In the example of FIG. 24A, the dummy patterns DMt need not be located in the center of the mesa portion MS because, even when the template 21 is bent, the contact of the central portion of the mesa portion MS with the process film PF is prevented by the actual pattern AC and the dummy pattern DMp located near the center of the mesa portion MS.

The droplets of the resist material 93 are located at the positions overlapping with the actual pattern AC and the dummy pattern DMp on the process film PF in the vertical direction. Droplets of the resist material 95 are located at the positions overlapping with the dummy patterns DMt in the vertical direction.

In Modification 4, the number of droplets of the resist materials 93 and 95 may be adjusted according to the sizes, the uneven portion shapes, and the like in the corresponding pattern of the template 21.

Figure 24B:
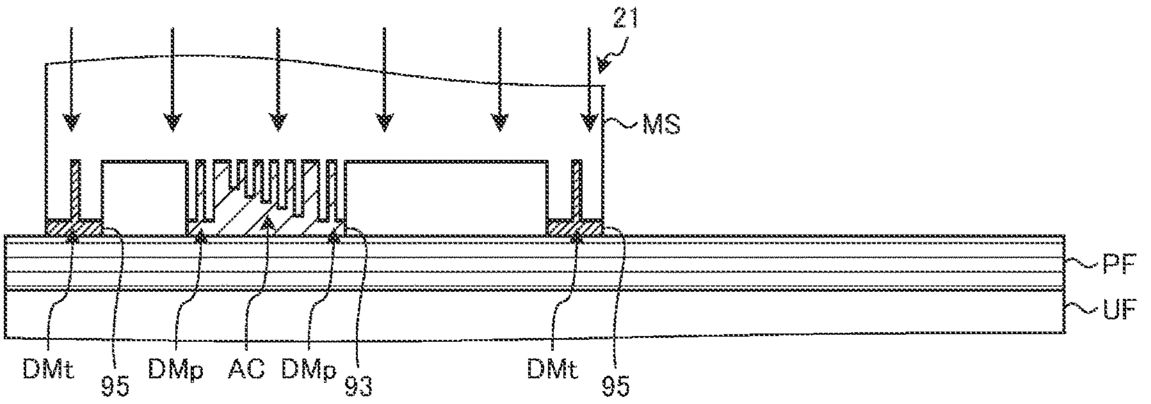

As illustrated in FIG. 24B, the actual pattern AC and the dummy patterns DMp and DMt of the template 21 are pressed against the droplets of the resist materials 93 and 95 with a slight gap left between the process film PF and the columnar-shaped pattern CL having the largest protrusion amount in the actual pattern AC.

Once the insides of the actual patterns AC and the dummy patterns DMp and DMt of the template 21 are filled with the resist materials 93 and 95, the resist materials 93 and 95 are irradiated with light such as ultraviolet light and cured while being pressed against the template 21.

Figure 24C:
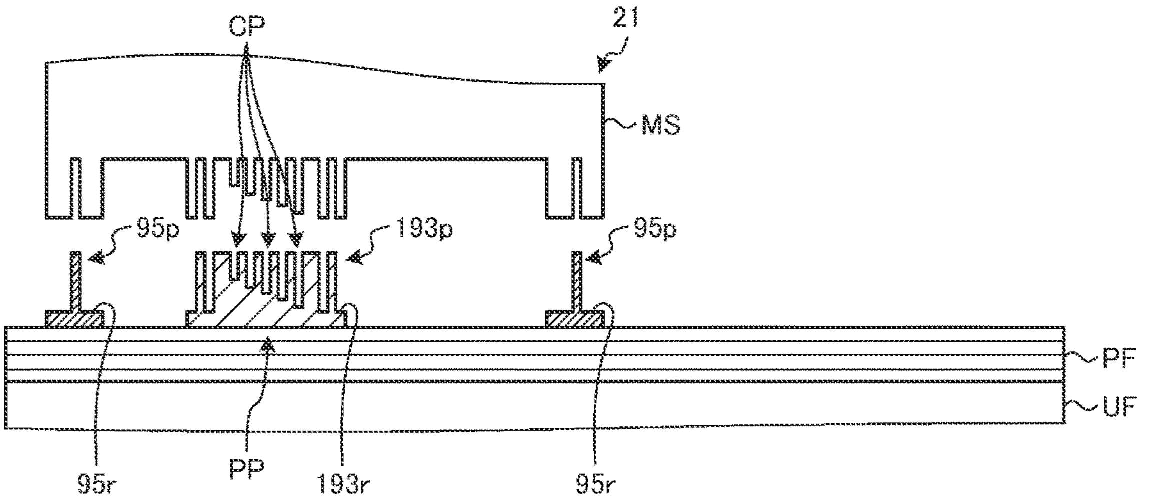

As illustrated in FIG. 24C, when the template 21 is released from the mold, the resist patterns 193*p* and 95*p* are formed.

Figure 25A:
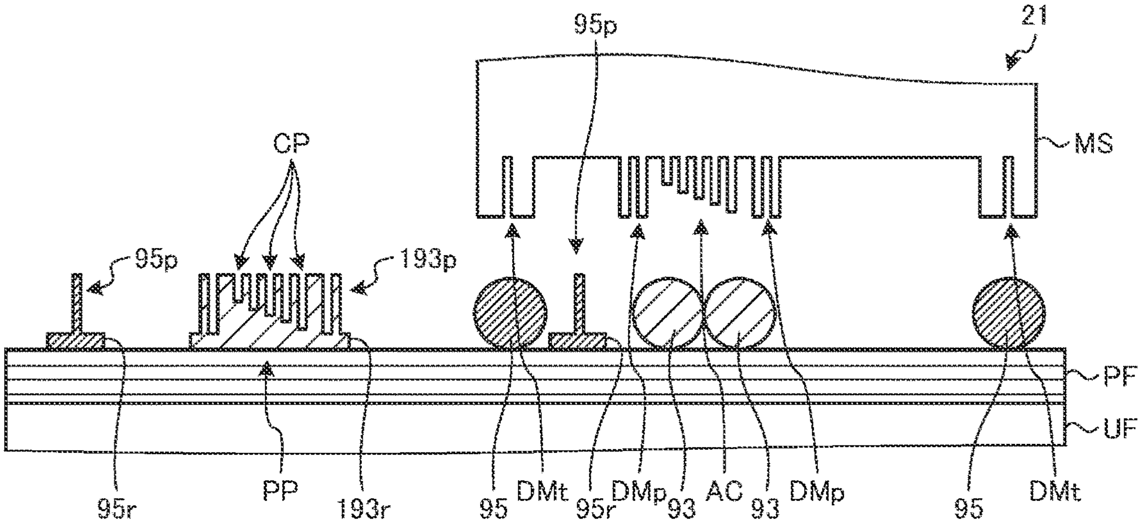
FIGS. 25A to 25C are cross-sectional views sequentially illustrating a part of a procedure of an imprint process using the template according to a Modification 4 of Embodiment 2.

As illustrated in FIG. 25A, in the same order and at the same intervals as resist materials 93 and 95 located on the process film PF in the process of FIG. 24A, the additional (new) droplets of resist materials 93 and 95 are located at positions offset from the already formed resist patterns 193*p* and 95*p* by a predetermined distance in one direction along the process film PF.

The relative position between the template 21 and the process film PF is moved so that the droplets of the newly located resist materials 93 and 95 and the actual patterns AC and the dummy patterns DMp and DMt overlap with each other in the vertical direction.

Figure 25B:
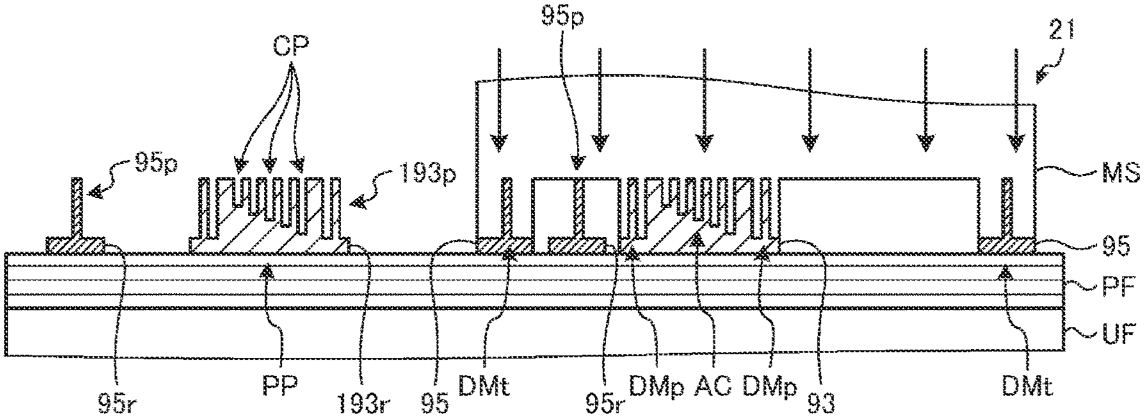

As illustrated in FIG. 25B, the actual pattern AC and the dummy patterns DMp and DMt of the template 21 are pressed against the new droplets of the resist materials 93 and 95 with a slight gap left between the process film PF and the columnar-shaped pattern CL having the largest protrusion amount in the actual pattern AC.

After the insides of the actual patterns AC and the dummy patterns DMp and DMt of the template 21 are filled with the resist materials 93 and 95, the resist materials 93 and 95 are irradiated with light such as ultraviolet light and cured while being pressed against the template 21.

Figure 25C:
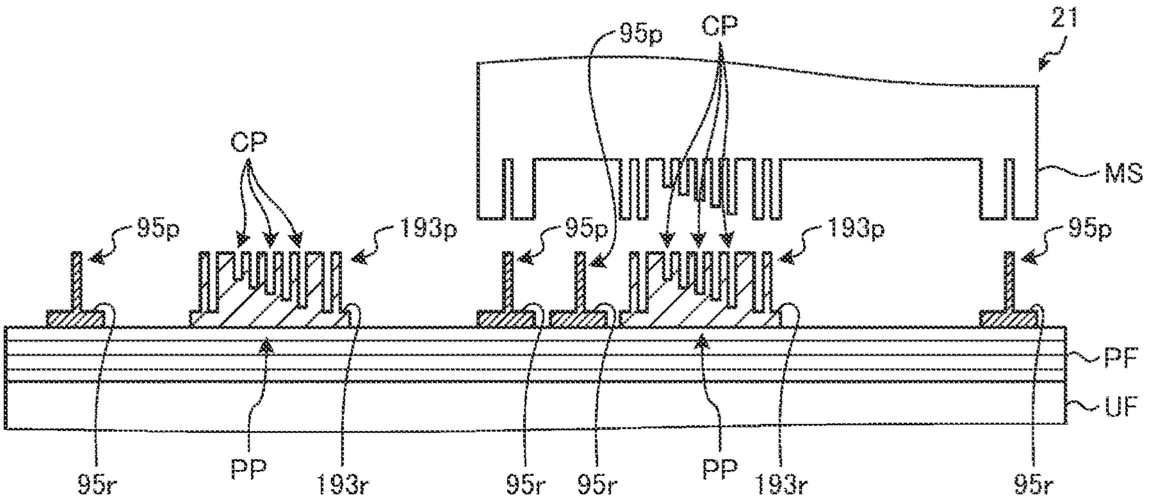

As illustrated in FIG. 25C, when the template 21 is released from the mold, the resist patterns 193*p* and 95*p* in which the actual patterns AC and the dummy patterns DMp and DMt are respectively transferred to the new droplets of the resist materials 93 and 95 are formed.

As a result, a resist pattern including the resist patterns 193*p* and 95*p* formed in the transfer process of the first time and the resist patterns 193*p* and 95*p* formed in the transfer process of a second time is formed.

Thereafter, the process of FIGS. 5A to 6F described above is performed, and holes CH having different reaching depths are formed in the process film PF as in Embodiment 1. Further, the contacts CC are formed from these holes CH, for example, so that the semiconductor device MDV described above can be manufactured.

In the process of FIGS. 5A to 6F described above, instead of the positive resist film 92, the negative resist film 94 may be used as in Modification 1 of Embodiment 1 described above.

In some examples, in the pattern forming method of performing the transfer process performed twice according to Modification 4, instead of the different types of resist materials 93 and 95, the transfer process may be similarly performed with just one type of resist material.

According to the pattern forming method of Modification 4, the template 21 is pressed against one or more droplets of the resist material 93 located on the process film PF, the resist patterns 193*p* to which the actual patterns AC and the dummy patterns DMp are transferred are formed, the template 21 is pressed against one or more droplets of the resist material 93 located on the process film PF and one or more droplets of the resist materials 95 located on the process film PF, the resist patterns 193*p* to which the actual patterns AC and the dummy patterns DMp are transferred and the resist pattern 95*p* to which the dummy patterns DMt are transferred are formed.

In this way, by forming the resist pattern including the resist patterns 193*p* and 95*p* in a divided manner, it becomes more difficult for air bubbles to be trapped, and thus formation defects of the resist patterns can be further prevented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern forming method, comprising:

placing a resin material on a film to be processed;

pressing a template having a plurality of patterns protruding from a reference plane against the resin material to form a first resin film having first and second patterns, which are separated from each other in a first direction, and a third pattern between the first and second patterns;

forming a second resin film to cover the first resin film and fill the first, second, and third patterns of the first resin film;

exposing and developing the second resin film to expose the first and second patterns while leaving the second resin film in the third pattern; and processing the film to be processed via the first and second resin films to transfer the first and second patterns to the film to be processed without transfer of the third pattern to the film to be processed.

2. The pattern forming method according to claim 1, further comprising:

forming a fourth pattern in the second resin film located above the third pattern when the second resin film is exposed and developed to expose the first and second patterns; and transferring the fourth pattern to the film to be processed when the film to be processed is processed via the first and second resin films.

3. The pattern forming method according to claim 1, wherein droplets of the resin material are dispensed onto the film to be processed when the resin material is placed on the film to be processed.

4. The pattern forming method according to claim 3, wherein the number of droplets dispensed at positions corresponding to each of the first to third patterns is set to correspond to volumes of the first to third patterns, respectively.

5. The pattern forming method according to claim 3, wherein the resin material comprises a first-type resin material and a second-type resin material different from the first-type resin material, a droplet of the first-type resin material is dispensed at a position corresponding to the first pattern, and a droplet of the second-type resin material is dispensed at a position corresponding to the third pattern.

6. The pattern forming method according to claim 1, wherein the third pattern is a dummy pattern.

7. The pattern forming method according to claim 6, wherein each of the first and second patterns includes multi-depth portions which protrude from the reference plane for different distances.

8. The pattern forming method according to claim 7, wherein the third pattern includes only a single depth portion.

9. The pattern forming method according to claim 1, wherein each of the first and second patterns includes multi-depth portions which protrude from the reference plane for different distances.

10. The pattern forming method according to claim 9, wherein the third pattern includes only a single depth portion.

11. The pattern forming method according to claim 1, wherein the transfer of the first and second patterns to the film to be processed uses the first resin film and a portion of the second resin film remaining in the third pattern as an etch mask.

* * * * *